US009015013B2

(12) United States Patent
Ivchenko et al.

(10) Patent No.: US 9,015,013 B2
(45) Date of Patent: Apr. 21, 2015

(54) DYNAMICALLY POWERING A POSITION AND ANGLE DIGITAL DETECTION AND SIMULATION OUTPUT

(71) Applicant: United Electronic Industries, Walpole, MA (US)

(72) Inventors: Olexiy Ivchenko, Stoughton, MA (US); Denys Kraplin, Holliston, MA (US)

(73) Assignee: United Electronic Industries, Inc, Walpole, MA (US)

( * ) Notice: Subject to any disclaimer, the term of this patent is extended or adjusted under 35 U.S.C. 154(b) by 29 days.

(21) Appl. No.: 14/058,169

(22) Filed: Oct. 18, 2013

(65) Prior Publication Data

US 2014/0114631 A1    Apr. 24, 2014

Related U.S. Application Data

(63) Continuation of application No. 13/152,218, filed on Jun. 2, 2011, now Pat. No. 8,594,981, which is a continuation-in-part of application No. 12/143,797, filed on Jun. 22, 2008, now Pat. No. 7,957,942.

(51) Int. Cl.
| | |
|---|---|
| *G06F 17/50* | (2006.01) |
| *G01C 25/00* | (2006.01) |
| *G09B 9/12* | (2006.01) |
| *H02K 41/025* | (2006.01) |
| *G01D 5/22* | (2006.01) |

(52) U.S. Cl.
CPC .......... *G06F 17/5009* (2013.01); *G01C 25/005* (2013.01); *G01D 5/2291* (2013.01); *Y02T 10/82* (2013.01)

(58) Field of Classification Search
USPC ................. 703/2, 4, 13; 324/207.25; 318/648
See application file for complete search history.

(56) References Cited

U.S. PATENT DOCUMENTS

| | | | | |
|---|---|---|---|---|
| 6,942,469 | B2* | 9/2005 | Seale et al. ................. | 417/413.1 |
| 7,957,942 | B2* | 6/2011 | Ivchenko et al. ................ | 703/2 |
| 2001/0043450 | A1* | 11/2001 | Seale et al. ..................... | 361/160 |
| 2006/0171091 | A1* | 8/2006 | Seale et al. ..................... | 361/160 |
| 2007/0205041 | A1* | 9/2007 | Nishizaki et al. ............. | 180/446 |
| 2007/0222405 | A1* | 9/2007 | Atarashi et al. ............... | 318/494 |
| 2008/0024082 | A1* | 1/2008 | Atarashi et al. ............... | 318/496 |
| 2009/0206827 | A1* | 8/2009 | Aimuta et al. ........... | 324/207.25 |

* cited by examiner

*Primary Examiner* — Thai Phan
(74) *Attorney, Agent, or Firm* — NextWave IP Legal Services, LLC; Leon Fortin Jr.

(57) ABSTRACT

A position detection and simulation platform includes software configurable logic and programmable inputs and outputs to support software configuration only changes for use with a variety of position feedback devices including synchros, resolvers, linear variable differential transformers, and rotary variable differential transformers. Power to the software configurable outputs is dynamically controlled so that the power supply voltage presented to the outputs satisfies a minimum threshold above the amplitude of the output signal. Dynamic control is based on at least one of a digital representation of a signal to be output, an analog version of the signal to be output, or the signal being output.

20 Claims, 14 Drawing Sheets

DYNAMICALLY POWERING A POSITION AND ANGLE DIGITAL DETECTION AND SIMULATION OUTPUT

CROSS-REFERENCE TO RELATED APPLICATIONS

This application is a continuation-in-part of U.S. patent application Ser. No. 12/143,797 filed Jun. 22, 2008 which is incorporated by reference in its entirety.

BACKGROUND

1. Field

The methods, systems, objects, features, and advantages of the present invention generally relate to transformer coupled position sensing and simulation thereof. In particular they relate to providing universal sensing, control, and simulation of synchros, resolvers, linear variable differential transformers (LVDT), and rotary variable differential transformers (RVDT).

2. Description of the Related Art

Converting angular rotation or linear displacement to an electrical signal may be performed by an AC transducer. Types of transducers include synchros, resolvers, and linear/rotary variable differential transformers (LVDTs/RVDTs). They can be used in a variety of applications, such as an inertial navigation reference unit (gyro or compass), an automatic direction finder (ADF), an omni range system, distance measurement equipment, cockpit indicators, landing-gear positioning and control, various industrial applications, motor control, position detection, machine tool control, oil field exploration, navigation, flight simulation, and many other relative position detection applications.

Synchros, resolvers, LVDTs, and RVDTs have been used in a variety of military and commercial systems for many years, because of the high degree of reliability when difficult environment conditions exist. The simplicity of operation when combined with superior reliability makes these non-contact position sensors a very attractive component of industrial control, operation, simulation and the like. In an example, a resolver or synchro in an automatic direction finder is used to provide an electrical signal that may drive an indicator. As an aircraft turns, the amount of coupling in the transducer changes proportionally. There are many other examples of use of these relative position sensing technologies that populate the known art.

While synchros, resolvers, LVDTs, and RVDTs output an electrical signal, the output signal typically must be converted to a digital signal for processing, and other operations associated with computerized motion sensing, control, simulation and the like. Digital converters are commonly configured with hardware that is tailored to meet voltage and frequency requirements associated with particular synchro, resolver, LVDT, or RVDT implementation specifications. Hardware-tailoring is commonly implemented through selection of certain combinations of electrical components that support the implementation specifications. However, there are a wide variety of implementation specifications across even a single industry, such as avionics. Therefore to offer products that can be sold to even a single customer in a single industry, a converter supplier may have to offer a variety of differently tailored converters. Consequently, each unique implementation requires a correspondingly uniquely tailored converter, resulting in increases in converter ordering complexity, service parts stocking, installation and maintenance procedures, and the like. Also, while hardware-tailored converters may facilitate digital conversion, they cannot be used with different synchro, resolver, LVDT, and/or RVDT implementations. Therefore as new implementation requirements arise, new hardware-tailored converters must be designed, tested, and offered for sale, thereby slowing down converter customer development cycles. Hardware-tailored converters increase costs throughout the supply chain—including manufacturers, distributors, integrators, customers, maintenance suppliers, and the like. There are certain implementations that hardware-tailored converters cannot support, such as calibration and test. Because the hardware is tailored to a particular implementation specification, determining a degree of calibration within the particular implementation specification cannot be achieved without changing the hardware, such as using a dedicated calibration or test device.

In an example, hardware tailoring may include using differential sensing circuits—such as differential amplifiers to produce a measurable analog signal from the synchro, resolver, LVDT, or RVDT. Signal amplification is quite common in these applications because without a measurable signal, digital conversion is not possible. However, a 4-wire implementation requires different sensing hardware than a 5-wire or a 6-wire implementation. Consequently, even if frequencies and voltages are identical for each of the 4, 5, and 6-wire implementations, uniquely tailored differential sensing circuitry must be provided.

SUMMARY

Reduction of power consumption is desirable for improving product reliability, cooling and operational costs, reduction in form factor, among others. Devices and systems that are configured to provide high drive currents demand more power for output driver circuits. Power consumption in high current output drivers is a function of the supply voltage presented to the device, so optimizing the supply voltage based on the output demand may provide a significant reduction in power dissipation of this portion of a system. Output drivers are known to be capable of providing high output current so long as a the supply voltage present exceeds the output signal voltage by at least a minimum threshold that is specified by the driver manufacturer. Therefore, dynamic signal-based power delivery, may ensure robust high current output capabilities while mitigating heat buildup in the vicinity of the output drivers. The following disclosure describes methods and systems for delivering supply voltage(s) to amplifier/drivers of software controllable outputs that are described herein, wherein the supply voltages maintain the minimum threshold, while minimizing power consumption of the output drivers.

In an aspect of the methods and systems described herein, a method of dynamically powering a software configurable output may include receiving a representation of a signal; determining, based on a software configurable parameter of the software configurable output, an expected amplitude of a driven output of the signal; adjusting a power supply voltage based on the expected amplitude; and providing the power supply voltage to a power supply input of a signal driver for generating the driven output. In the method the software configurable outputs are suitable for providing at least one of rotor excitation signals and simulated stator output signals. Alternatively in the method, adjusting a power supply voltage comprises increasing the power supply voltage if the expected amplitude is greater than a current amplitude. Also, adjusting a power supply voltage comprises decreasing the power supply voltage if the expected amplitude is less than a current amplitude. In the method, receiving a representation of a signal comprises receiving digital waveform data and/or receiving output control data. Note that the output control data affects one or more of gain, phase shift, and offset of the driven output.

In another aspect of the methods and systems described herein, a method of signal-based powering of a flight simulator signal driver may include providing a flight simulation signal to a signal driver for generating a flight simulator output and controlling a supply voltage for powering the signal driver so that the supply voltage tracks the simulation signal, wherein the supply voltage exceeds an amplitude of the flight simulator output by at least a power supply-to-signal threshold. In the method, controlling a supply voltage comprises generating feedback to a power supply based on the flight simulation signal. Also, the power supply is a DC/DC power converter. Note that the flight simulator output comprises a simulated stator signal. In the method, controlling a supply voltage comprises determining, based on a change in the flight simulation signal, an expected amplitude of the flight simulator output and adjusting a power supply voltage based on the expected amplitude. Alternatively, controlling a supply voltage is based on output control data that affects one or more of gain, phase shift, and offset of the flight simulator output.

In yet another aspect of the methods and systems described herein, a system for dynamically determining a software configurable output power supply feedback signal may include a processor accessible memory for storing digital waveform data for presenting to a software configurable output; a power supply feedback generation engine for generating a digital representation of the power supply feedback signal based on the digital waveform data; a phase adjust facility for providing the waveform data to the feedback generation engine, wherein the waveform data is provided to the feedback generation engine shifted in time relative to presenting corresponding waveform data to the software configurable output; and a digital-to-analog converter for converting the digital representation of the power supply feedback signal to a signal that is suitable for controlling a power supply output voltage of an adjustable power supply. In the system, the software configurable outputs are suitable for providing at least one of rotor excitation signals and simulated stator output signals. Also, in the system the power supply feedback generation engine generates a digital representation of the feedback signal that indicates to the adjustable power supply to increase the power supply output voltage if the waveform data indicates an increase in amplitude of the software configurable output. The power supply feedback generation engine may also generate a digital representation of the feedback signal that indicates to the adjustable power supply to decrease the power supply output voltage if the waveform data indicates an decrease in amplitude of the software configurable output. In the system, the adjustable power supply is a DC/DC power converter. Also in the system, the software configurable output is suitable for providing at least one of rotor excitation signals and simulated stator output signals. the system may further include a software configurable output feedback facility for providing a digital representation of the software configurable output to the power supply feedback generation engine.

With the applications of synchros, resolvers, LVDTs, and RVDTs covering a wide range of industries, uses, operating modes, tracking rates, environments, and the like; a wide range of these devices are available to support various implementation specifications. Features, configurations, and operating modes of these devices must support the application needs for avionics, simulation, training, test, measurement, industrial automation, motor control, robotics, navigation, and the like. Similarly, converters that facilitate digital acquisition, control, processing, and management of this wide range of devices in these highly varying applications may require a rich and broad set of features, capabilities, interfaces, and the like. Therefore a digital position detection and simulation platform is presented herein.

The digital position detection and simulation platform may support a wide range of features, configurations, implementation specifications, device interfaces, and the like in a programmable environment that offers flexible configuration. The flexibility of the programmable environment of the platform may allow the platform to be applied to a wide variety of applications in industries such as avionics, aerospace, industrial control, robotics, test and measurement, simulation, and the like. Unlike hardware-tailored systems that have limited applicability, the digital position detection and simulation platform may be configured through software to operate in a wide variety of applications including flight control and monitoring, flight simulation, shipboard navigation, oil field exploration, motor control, machine tool control, antenna positioning, fire control and the like.

The digital position detection and simulation platform may include configurable and programmable logic to support the wide range of features. The logic may be programmable through a software interface based around a framework that may provide a comprehensive, yet easy to use programming interface (API) for computer operating systems, such as Windows, Linux, and various real time operating systems. The configurable and programmable logic may be implemented with commercial off the shelf components, such as Field Programmable Gate Arrays (FPGA), analog to digital converters, and the like.

The digital position detection and simulation platform may include programmable interface features that facilitate supporting a wide range of synchro and resolver input configurations. Exemplary interface features may include supporting S-wire synchro and 4-wire resolver, excitation and input frequencies up to 4000 Hz or more, signal input up to 28 Vrms or higher, and the like. The programmable interface features may also support LVDT/RVDT input configuration features, such as for example 4, 5, and 6-wire configurations, up to 28 Vrms or greater signal input, up to 5000 Hz or greater excitation frequency, and the like.

The digital position detection and simulation platform may include programmable LVDT/RVDT output or simulation features that support 2, 3, and 4-wire interfaces, up to 10 Vrms output voltage, high current drive of 50 mA and the like. The platform may support programmable synchro/resolver output or simulation features such as 3-wire and 4-wire configurations, up to 28 Vrms, and other features.

The example interface and output features described herein do not specifically limit the range of embodiments. Instead, they represent sample features of an exemplary embodiment.

In an aspect of the invention, a position feedback interface and simulator system includes a plurality of software configurable inputs suitable for receiving one or more of stator output signals and rotor excitation signals; a plurality of software configurable input processing circuits for converting the signals into digital samples and for determining frequency characteristics of the signals; a processor accessible memory for storing the digital samples; a plurality of software configurable outputs suitable for providing at least one of rotor excitation signals and simulated stator output signals based on at least a portion of the frequency characteristics; a processor accessible memory for storing digital waveform data; and a plurality of software configurable conversion circuits for converting waveform data to an electrical signal, and for providing the electrical signal to at least one of the plurality of software configurable outputs.

In the aspect, the processor accessible memory for storing digital waveform data is a FIFO. The aspect further includes a processor accessible memory for storing waveform conversion and output control data. The conversion and output control data affects one or more of gain, phase shift, and offset associated with the at least one of the plurality of software configurable outputs.

The aspect further includes a software framework for facilitating configuring the inputs, the outputs, the input processing circuits, and at least one of storing digital waveform data and retrieving acquired digital samples.

The aspect further includes a processor signaling function for generating a signal based on an assessment of the frequency characteristics. In the aspect, an assessment of the frequency characteristics includes comparing a measurement of acceleration of at least one of the signals to an acceleration warning threshold.

In the aspect, determining frequency characteristics includes an arctangent recovery calculation. The arctangent recovery calculation includes a base polynomial that is adjusted by a recovery factor that includes a recovery value and an operation that are determined based on a relationship of sine and cosine frequency characteristics, wherein the recovery value is selected from the set consisting of 0*PI( )/2, 1*PI( )/2, 2*PI( )/2, and 3*PI( )/2, and wherein the operation is selected from the set consisting of subtracting the base polynomial from the recovery value and adding the base polynomial to the recovery value.

In the aspect, the input processing circuits facilitate measuring an acceleration of at least one of the signals.

In another aspect of the invention, a method of stator signal simulation includes providing an angle and position detection platform having a plurality of identical channels; programming a first channel to receive a plurality of stator signals; converting the stator signals to digital data based on a first excitation signal; storing the digital data in a first processor accessible memory associated with the platform; programming a second channel to simulate a plurality of stator signals, wherein programming includes storing digital waveform data in a second processor accessible memory; and transmitting simulated stator signals using the data stored in the second memory based on a second excitation signal.

In the aspect, the platform derives at least one of the first excitation signal and the second excitation signal from a reference clock associated with the platform.

The aspect further includes receiving external excitation and deriving at least one of the first excitation signal and the second excitation signal therefrom. In the aspect, one of the first excitation signal and the second excitation signal is derived from the reference clock and the other of the first excitation signal and the second excitation signal is derived from the eternal excitation.

In the aspect, the simulated stator signals can be adjusted at least once per simulated signal cycle. The adjustment includes gain, offset, and phase. The simulated stator signals are adjusted contemporaneously with a zero—crossing of the second excitation signal.

In yet another aspect of the invention, a method of flight simulation includes providing a position detection and simulation platform comprising a plurality of functionally identical channels; exciting at least two of the plurality of channels to simulate stator output signals, wherein the at least two of the plurality of channels are configured to generate at least one of different frequency, phase delay, gain, and offset; communicating the simulated signals to a flight simulator user interface; and controlling at least two flight indicators based on the signals, wherein the at least two flight indicators indicate different flight functions.

In the aspect, exciting includes generating excitation by the platform. In the aspect, exciting includes receiving excitation into the platform.

In another aspect of the invention, a method of multi-resolution position detection includes providing a position detection and simulation platform; receiving an excitation signal and stator signals associated with a first rotor; detecting a first rotor position using the received signals; transmitting an excitation signal to a second rotor; receiving signals into the platform from stators associated with the first and second rotors in response to the second rotor excitation; and detecting a second rotor position based on the received signals.

In another aspect of the invention, a method of using a platform in two different applications without changing platform hardware includes providing a position detection platform; using the platform to receive and detect a position of a first position feedback device based on a software configuration of the platform; and using the platform to receive and detect a position of a second position feedback device based on an alternate software configuration of the platform. In the aspect, the first feedback device is selected from the set consisting of a resolver and a synchro. In the aspect, the second feedback device is selected from the set consisting of an LVDT and an RVDT. In the aspect, the first feedback device is selected from the set consisting of an LVDT and an RVDT. In the aspect, the second feedback device is selected form the set consisting of a resolver and a synchro. In the aspect, the first device is a synchro and the second device is a resolver. Alternatively in the aspect, the first device is a resolver and the second device is a synchro.

In an aspect of the invention, simulation using excitation includes sampling excitation, counting a number of reference clocks for one complete excitation cycle, generating a simulation output clock therefrom, measuring drift in the excitation, adjusting the simulated output clock based on the measured drift at least once per output cycle.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures.

DETAILED DESCRIPTION

Figure 1:
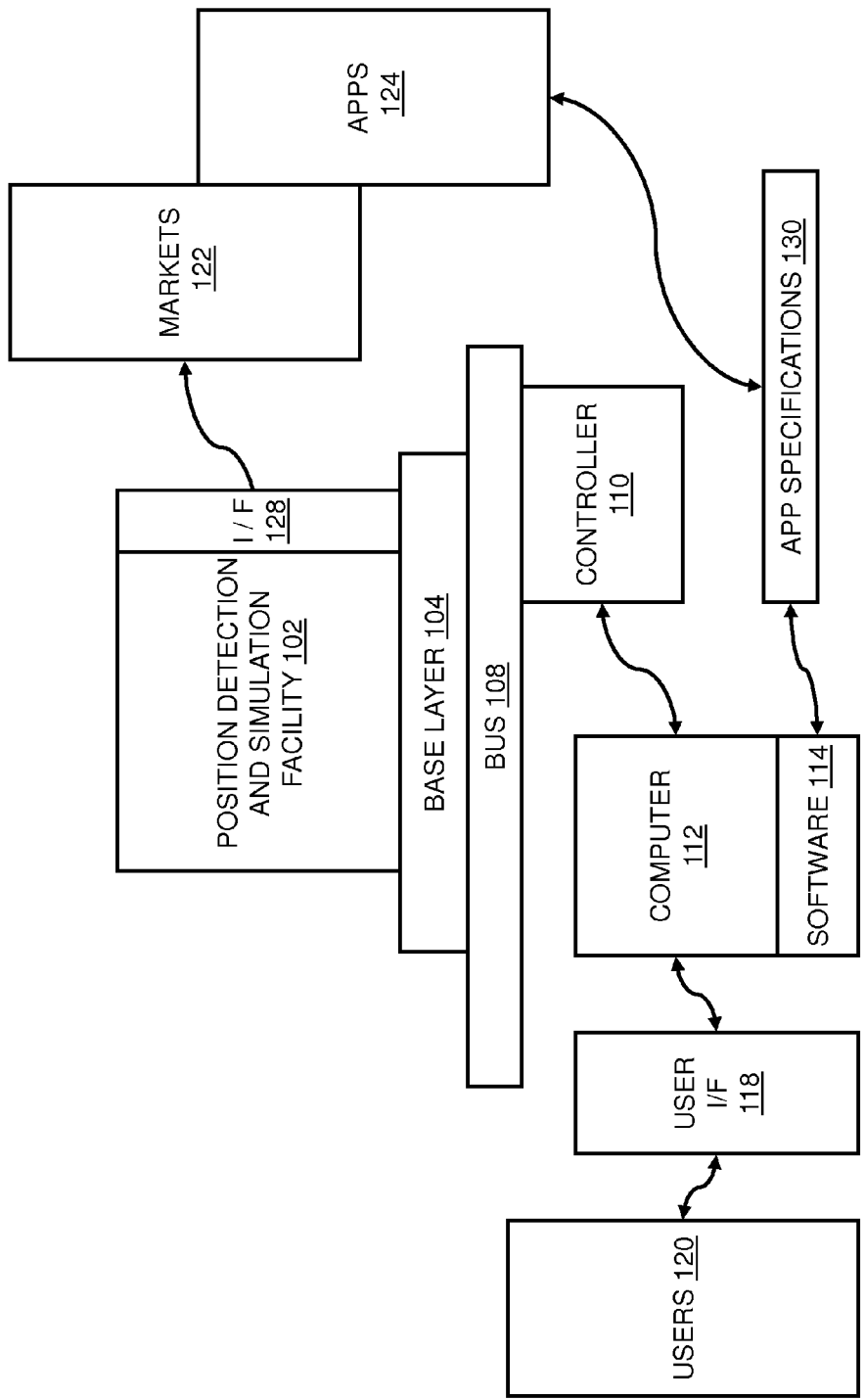
FIG. 1 depicts a block diagram of an overview of the platform.

A position detection interface and control platform may be embodied in a layer structure that may conform to a base layer of an analog input family of products. The platform may be embodied as an attachment to the base layer. The platform may include a plurality of channels, wherein a channel has associated with it one or more input stages, one or more output stages configured so that each channel may function as an isolated multifunctional data acquisition system.

The platform may be implemented as a layer for LVDT/RVDT type applications and may include a plurality of isolated channels with at least up to a +/−40 volt input range, a plurality of high resolution analog to digital converters (ADCs) operating independently over a wide frequency range including up to at least 330 KHz, input processing logic that automatically calculates position at a rate equal to two times an excitation frequency, a FIFO for storing data such as rotor position and the like, and at least one analog output driven by a high precision digital to analog converter (DAC) operating over a wide frequency range including up to at least 250 KHz that is capable of outputting pre-loaded waveforms with various types of time and phase shift with dynamic offset and gain adjustment. When more than one output is embodied, pairs of outputs may be linked to form a differential pair of outputs, thereby quadrupling at least the output voltage range.

The platform may be implemented as a layer for synchro/resolver type applications and may include a plurality of isolated channels with up to a +/−40 volt input range, a plurality of high resolution analog to digital converters (ADCs) operating independently over a wide frequency range including up to at least 330 KHz, input logic that may automatically calculate synchro/resolver angle at a rate equal to two times an excitation frequency associated with the synchro/resolver, a FIFO for storing data such as input position and the like, and at least one analog output driven by a high precision digital to analog converter (DAC) operating over a wide frequency range including up to at least 250 KHz that is capable of outputting pre-loaded waveforms with various types of time and phase shift plus dynamic offset and gain adjustment.

The digital position detection and simulation platform and associated elements may be implemented in digital and analog circuits that take advantage of high precision circuitry to accomplish a high degree of isolation, similar to galvanic isolation among all inputs and outputs, and between any input and digital circuitry. In embodiments, the digital position detection and simulation platform may provide a high degree of synchro/resolver accuracy using commercial off the shelf components, such as standard commercial grade devices. In an example 2.6 arc-minutes of accuracy is readily achievable. In fact, accuracies that are ten times greater than this example are possible with the platform. Such greater accuracies may be achieved when digital sample averaging is used. To support a wide variety of features, functionality, programmability, expandability, and general flexibility, the platform may be implemented using programmable logic devices. Programmable logic devices may also facilitate providing the features, and etceteras in performance grades that support real-time functionality for input detection, internal excitation, simulation, and the like. Software configurability may be provided by a framework of software, such as one or more APIs that support various standard and real-time operating systems (e.g. Windows, Linux, QNX, RTX, RT Linux, and the like). The framework may facilitate application development and deployment in environments such as LabVIEW, MATLAB/Simulink, DASYLab, Active X, and OPC servers. The combination of programmable logic and software framework may support highly parameterized operation and configuration that may support user configurability through preconfigured application packages, library based configuration options, default parameters for a wide variety of industry applications, and the like. In addition to setting parameters to control functionality, performance, and operation of the platform, the platform may facilitate self adjusting parameters based on feedback such as from logical processing of input of signals. The platform may be available in a variety of form factors including a form factor suitable for use in a cube product, a form factor suitable for use in a rack such as the RACKtangle chassis, and any other form supporting electronic circuitry. The platform may confirm with industry standard backplanes and bus architectures. The platform may enable expandability such as multiple channels per module, multiple modules per chassis, and the like.

The Referring to FIG. 1, an overview block diagram of the digital position detection and simulation platform 100, the platform may include a digital position detection and simulation facility 102, a base layer 104 through which the digital position detection and simulation facility 102 interfaces with a control bus 108, a controller 110 that communicates with a computer 112 that hosts framework software 114. The framework software 114 may include or may communicate through a user interface 118 to users 120 for the purposes of digital position detection and simulation platform 100 configuration, programming, operation, monitoring, and the like. The platform 100 may also include uses in various markets 122 that may be associated with various position detection applications 124. The digital position detection and simulation facility 102 may interface to the various market applications 124 through a programmable and versatile interface 128. Software 114 may access application specification 130 to ensure the position detection and simulation facility 102 is properly configured for the application 124.

The base layer 104 may provide bus interface features that may support interfacing the digital position detection and simulation facility 102 to other devices on the bus 108, such as the controller 110. The framework software 114, which may be hosted by a computer 112, such as a personal computer operating a Windows or similar operating system, may support configuring all programmable and configurable aspects of the digital position detection and simulation platform 100 such as through an application programming interface (API) and may provide communication to the digital position detection and simulation facility 102 through the controller 110. Alternatively, the computer 112 may interface through a high speed network such as an Ethernet network with appropriate interface to the bus 108. The framework software 114 may support popular operating systems such as Windows, Linux, real-time operating systems such as QNX, RTX, RT Linux, and the like. The framework may facilitate application development in LabVIEW, MATLAB/Simulink, DASYLab, and other application development environments that support ActiveX or OPC servers.

Markets 122 may include aeronautics, avionics, flight control, flight simulation, industrial control, robotics, navigation, automated production, oil field exploration and operation, and any market that requires any of measurement, control, simulation, and test of motion electronics. Markets 122 may be associated with a wide variety of position detection and/or simulation applications 124 such as jet engine control, cockpit indicators, landing gear positioning and control, flap actuators, rudder control, ailerons, automatic direction finders, cockpit simulation, inertial referencing, radar, robotics control, oil well operation, motor control, motor commutation, machine tool control, process control, antenna positioning, data acquisition, fire control, production test, calibration, and the like.

The markets 122 and applications 124 may be served by the digital position detection and simulation platform 100 by accessing that application specifications 130 for a particular application 124 or application/market combination, such as by the software 114, and configuring the features, performance, interfaces, functions, and logic of the position detection and simulation facility 102 accordingly.

Figure 2:
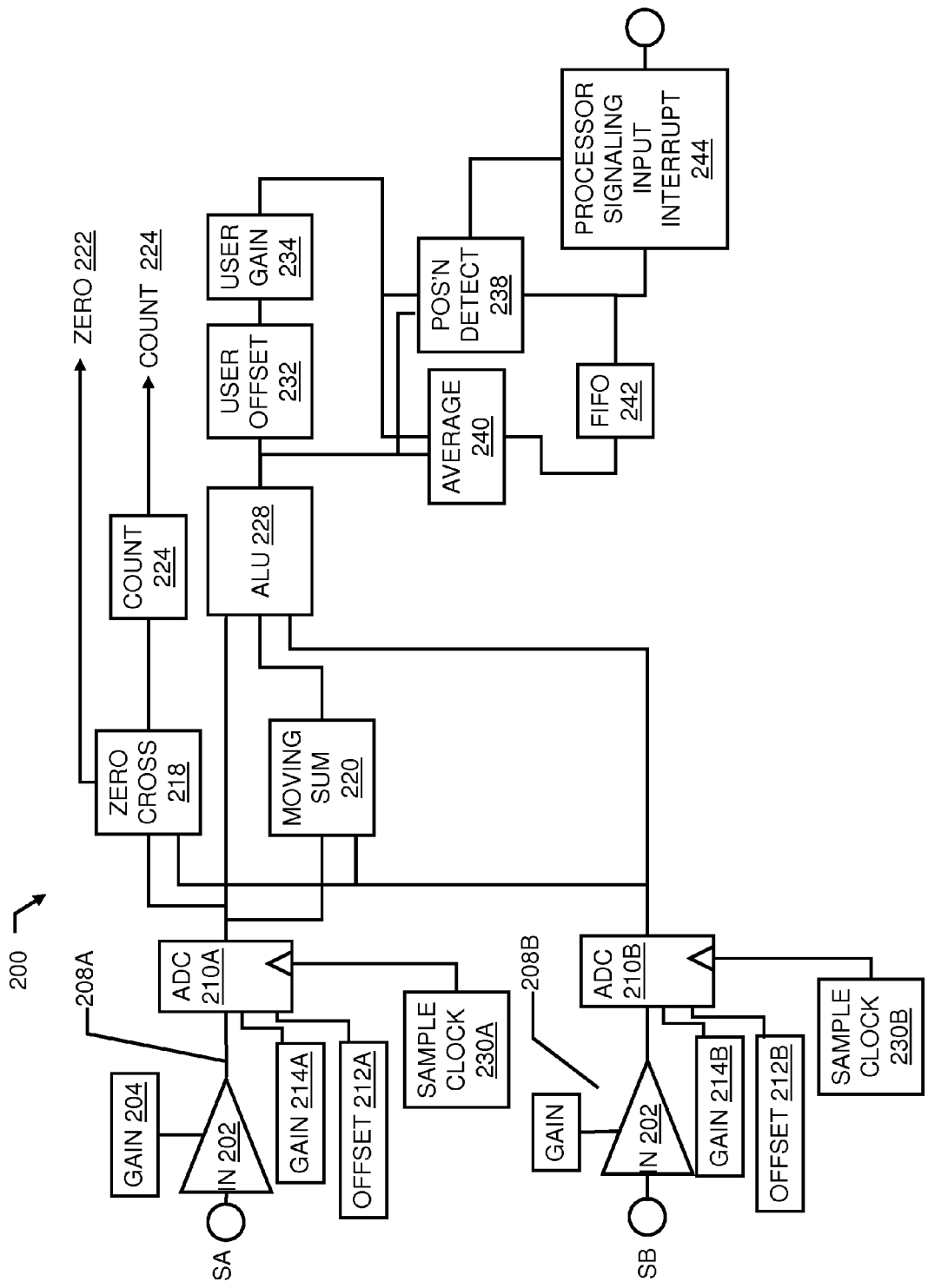
FIG. 2 depicts a schematic diagram of an input portion of the platform.

FIG. 2, a schematic view of an embodiment of an input portion of the digital position detection and simulation facility 102 of FIG. 1, includes features and options that may be applicable to LVDT and/or RVDT applications. In the embodiment of FIG. 2, two inputs A and B are represented. Features that may be the same for each input are generally described once. Where functions can be embodied with the same features and functions for each of the two inputs, referenced items are documented in the figure with the input designator A or B while this description refers to the referenced item without the input designator. Where differences are important, the input designator A or B is used in this specification. In an example, input A gain function is referenced in the figure as element 214A and input B gain function is 214B. In this specification, element number 214 refers to 214A, 214B, or both based on context. Explicit references to element 214A or 214B refer to only the specific input element.

The digital position detection and simulation platform 100 may receive signals from an LVDT/RVDT, such as through input SA or SB. Each input 202 may include individual programmable input gain 204 that may be set individually through software 114 in a software accessible input configuration register. Input gain 204 may be programmed for a variety of signal gain values, such as unit gain, 2× gain, 5× gain, 10× gain, other gain values based on the application specification 130, and the like. The input gain 204 may facilitate detecting LVDT/RVDT input signals that otherwise may be too small in amplitude to be properly sampled. In an example, the input gain 204 may be set to 5× for an input signal of amplitude 0.5 Vrms resulting in a gain adjusted input 208 of 2.5 Vrms. The gain adjusted input 208 may be sampled by an analog to digital converter 210, such as a successive approximation register (SAR) converter or other type of converter, which may be controlled through software. Software controls for the analog to digital converter 210 may include adjustments to calibration values for offset 212 and gain 214. In an example, gain 214 may range from a value of 0 to 2× substantially linearly throughout the range based on the value written to a gain 214 register. Analog to digital converter 210 may receive a sample clock 230 that may be based on a reference clock, an internally generated clock, or an externally provided clock. Analog to digital converter 210 sends converted digital data to at least a zero-cross detection facility 218 and a moving sum facility 220.

Inputs may be sampled at a high rate relative to other rates present in a configuration. Inputs may be sampled at 150 KHz or higher, whereas excitation inputs and therefore position and motion sensing signals may be in the range of 4 KHz. The high sample rate may result in very precise sampling of the inputs which may facilitate accurate digital reproduction of the input waveform. In this way, the digitized data that represents the analog input can be analyzed to detect important features such as zero crossing, signal acceleration, phase differences between inputs, and the like. Unlike systems that are based on the Nyquist-Shannon sampling theorem, there is no need for the sampling to have any specific relationship to the signal, therefore a wide variety of input frequencies can be supported by a common set of hardware components. Common mode noise and disturbances can readily be detected and eliminated in the digital data by comparing a plurality of inputs. By performing various digital waveform functions (addition, subtraction, time shifting, and the like), noise and disturbances that affect at least some of the plurality of inputs can be detected and removed. Additionally, due to the very high sample rate, filtering the signal well above its cycle rate (e.g. 4 KHz) results in a sampled signal that eliminates high frequency components from the sampled digital data. Therefore signal noise near the sample rate (e.g. 150 KHz) is filtered out before the signal is sampled. Using these and other well known techniques, signals received from rotors, stators, excitation sources, and other signals related to LVDT/RVDT applications and simulations are digitally stored and processed by the platform resulting in very high accuracy position detection and simulation reproduction.

A digital sample of the gain adjusted input signal 208 is evaluated by the zero-cross detection facility 218. The zero-cross detection facility 218 may include several software programmable configuration options, such as zero level, enable zero-cross detection, number of samples to average for the purposes of detecting the input signal 208 had crossed the programmed zero level, direction of zero-cross detection, zero-cross source (input or output signal), enable auto-zero functionality, input signal to detect zero-crossing, and other options associated with detecting a zero crossing. Zero-cross facility 218 may provide a zero signal 222 indicative of a when the evaluated signal crosses the programmed zero level. The zero signal 222 may facilitate notifying other elements of the platform 100 of a zero crossing event. A zero-cross count facility 224 may determine information related to one or more zero crossing events. In an example the zero-cross count facility 224 may track an interval between zero crossing events. The interval between zero crossing events may be based on a reference clock, such as a 33 MHz base clock, and the interval may be a count of the reference clocks between zero crossings.

The digital sample provided by the analog to digital converter facility 210 may be simultaneously or contemporaneously applied to moving sum facility 220, wherein a running average of samples may be calculated. The running average of samples may be provided to an ALU 228 for computing various mathematical functions related to the inputs.

ALU 228 may receive sampled input data from ALU 210A and ALU 210B as well as a separate running average for input A and B from the moving sum facility 220. The ALU 228 may perform computations of at least one of the inputs, and the computations may be based on a software programmable option or command that controls at least a portion of the ALU 228. In an example, the ALU 228 may perform functions such as $(Sa-Sb)/(Sa+Sb)$, $Sa/Sb$, $Sa/Se$, and the like, wherein $Sa$ is a value related to input A, $Sb$ is a value related to input B, and $Se$ is a programmed value. The resultant of the ALU operation may be passed to a user offset function 232 where a software programmed offset value may be added to the resultant. The offset resultant may then be passed to a user gain function 234 where the offset resultant can be adjusted by a software programmed user gain value. In an example the software programmed offset value may be a twos-compliment 24 bit value and the software programmed gain value may be a 24 bit binary multiplier. Other values, other types of values and gain and offset functions may alternatively be provided to implement functions associated with position detection. Also the offset function 232 and gain function 234 may be optional. One optional embodiment may include programming the offset function 232 for no offset and/or the gain function 234 for no gain thereby making the gain function 234 and/or the offset function 232 optionally applied during position detection or simulation.

Input processing associated with the digital position detection and simulation platform 100 may include passing the offset and gain adjusted resultant to a position detection function 238, an averaging function 240, or both. Additionally, because user offset 232 and user gain 234 are optional, ALU 228 resultant may be provided to the position detection function 238, the averaging function 240, or both.

The averaging function 240 may facilitate averaging/decimating samples by adding them together and then shifting the added samples to perform a decimating function. The averaging function 240 may generate resultant data that may be stored, at least temporarily, in a FIFO memory 242. The FIFO memory 242 may include sample time stamp data, raw sample value data, calibrated value data, averaged position, Sa and or Sb, raw ADC 210 output data, and the like. The FIFO memory 242 may be accessed by a host computer or controller over the bus 108 through the base layer 104 if needed.

Position detection function 238 may process data received from one or more of the ALU 228, user offset 232, user gain 234, average function 240, and FIFO 242 to determine status of the position of the LVDT/RVDT. Determining status may include comparing received data to one or more thresholds such as a maximum position, a minimum position, and the like. Each of the thresholds or comparison values may be software programmable. Additionally, the position detection function 238 may be software programmed to select the inputs to process, the data types being provided in the inputs, and the like. In an example, software programmability of the position detection function 238 may be beneficial in that detecting a position for raw ALU 228 data values may involve different processing than detecting a position of user calibrated (offset and/or gain adjusted) data.

Position detection function 238 may signal input interrupt function 244 to generate an interrupt signal that may be detectable through the bus 108 by software running on the controller and/or a host computer. Software processing of the interrupt signal may include reading data from the FIFO memory 242, adjusting values of one or more software programmable options, features, and registers of the digital position detection and simulation platform, and the like. Interrupts may also be generated based on status, such as calibrated data being ready in the FIFO 242, the FIFO 242 being empty, above a threshold, FIFO full, position above a maximum or other reference position value, position below a minimum or other low reference value, within a range, and the like.

Figure 3:
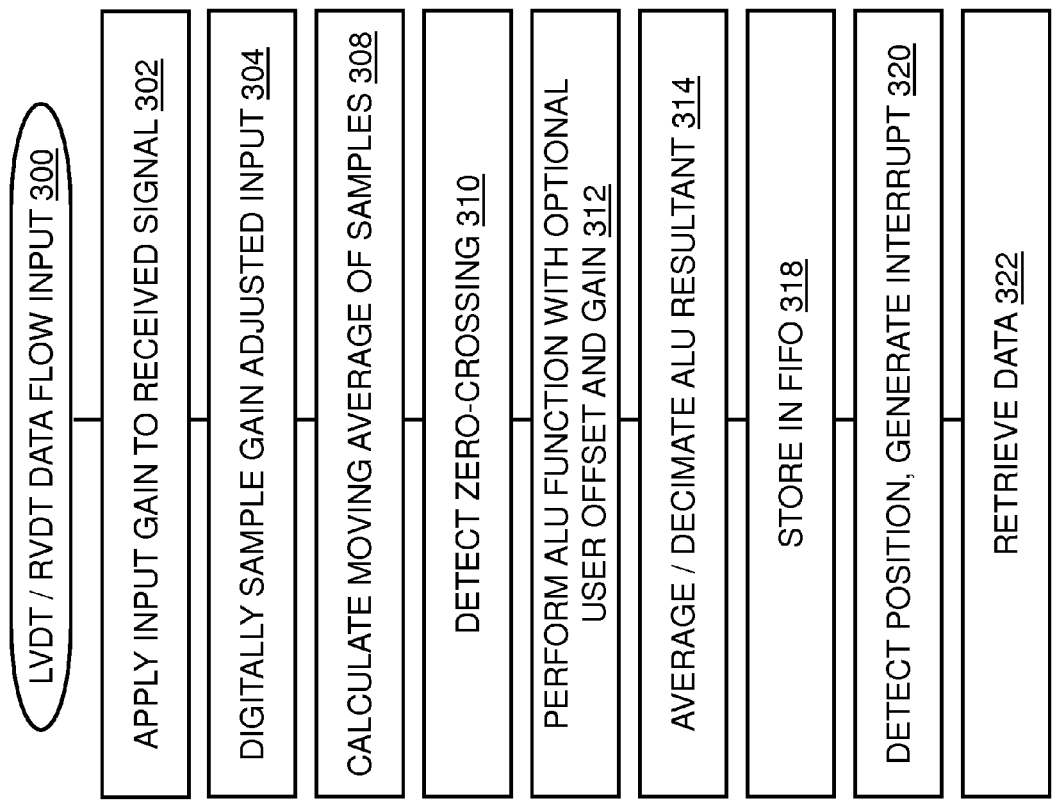
FIG. 3 depicts an input data flow chart for the embodiment of FIG. 2.

Referring to FIG. 3, an input data flow chart for an embodiment of the input functionality described above and depicted in FIG. 2, LVDT/RVDT data flow 300 may include receiving an LVDT/RVDT output signal and in step 302 applying an input gain to the received signal. Following step 302, step 304 may result in the gain adjusted received input signal being digitally sampled. In step 308 a moving average of the digitally sampled input signal may be calculated. Step 310, which may be performed in parallel with step 308, may result in detecting a zero-crossing of the LVDT/RVDT output signal. After steps 308 and 310, step 312 may perform various ALU functions and optionally may apply a user offset and gain function to the ALU resultant. The resultant is further processed at step 314 where it may be averaged and/or decimated based on requirements. In step 318, the data processed in step 314 may be stored in a FIFO or similar memory from which hit may be accessed and processed as in step 320 to detect the position of the LVDT/RVDT system relative to one or more thresholds. Also in step 320, one or more interrupts may be generated based on computations related to the position, the FIFO status, zero crossing, and the like. The LVDT/RVDT input data flow may conclude with a variety of data associated with the data flow being retrieved from the FIFO at step 322.

Figure 4:
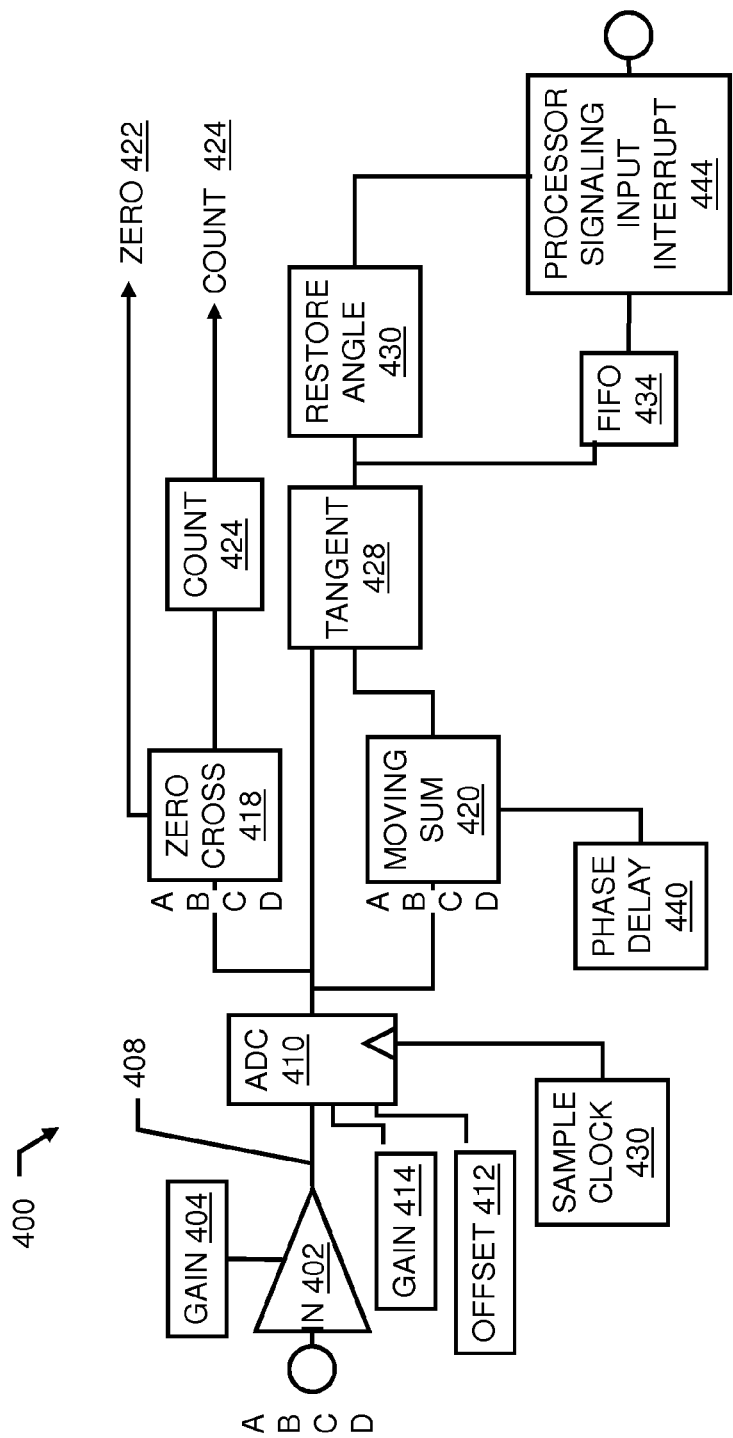
FIG. 4 depicts a schematic diagram of an alternate embodiment of an input portion of the platform.

FIG. 4, a schematic view of an alternate embodiment of an input portion of the digital position detection and simulation facility 102 of FIG. 1, includes features and options that may be applicable to synchro and/or resolver applications. In the embodiment of FIG. 4, four inputs A, B, C, D are represented. Features that may be the same for each input are generally described once. Where functions can be embodied with the same features and functions for each of the inputs, referenced items are documented in the figure and in this description without the input designator. Where differences are important, the input designator A, B, C, D is used in this specification. Explicit references to an element with an input designator refer to only the specific input element.

The digital position detection and simulation platform 100 may receive signals from a synchro or resolver, such as through input A, B, C, and D. Each input 402 may include individual programmable input gain 404 that may be set individually through software 114 in a software accessible input configuration register. Input gain 404 may be programmed for a variety of signal gain values, such as unit gain, 2× gain, 5× gain, 10× gain, other gain values based on the application specification 130, and the like. The input gain 404 may facilitate detecting synchro or resolver input signals that otherwise may be too small in amplitude to be properly sampled. In an example, the input gain 404 may be set to 5× for an input signal of amplitude 0.5 Vrms resulting in a gain adjusted input 408 of 2.5 Vrms. The gain adjusted input 408 may be sampled by an analog to digital converter 410, such as a successive approximation register (SAR) converter or other type of converter, which may be controlled through software. Software controls for the analog to digital converter 410 may include adjustments to calibration values for offset 412 and gain 414. In an example, gain 414 may range from a value of 0 to 2× substantially linearly throughout the range based on the value written to a gain 414 register. Analog to digital converter 410 may receive a sample clock 430 that may be based on a reference clock, an internally generated clock, or an externally provided clock. Analog to digital converters 410 for each of the inputs send converted digital samples to at least a zero-cross detection facility 418 and a moving sum facility 420.

Synchro and resolver inputs may be sampled at a high rate relative to other rates present in a configuration. Inputs may be sampled at 150 KHz or higher, whereas excitation inputs and therefore position and motion sensing signals may be in the range of 4 KHz. The high sample rate may result in very precise sampling of the inputs which may facilitate accurate digital reproduction of the input waveform. In this way, the digitized data that represents the analog input can be analyzed to detect important features such as zero crossing, signal acceleration, phase differences between inputs, and the like. Unlike systems that are based on the Nyquist-Shannon sampling theorem, there is no need for the sampling to have any specific relationship to the signal, therefore a wide variety of input frequencies can be supported by a common set of hardware components. Common mode noise and disturbances can readily be detected and eliminated in the digital data by comparing a plurality of inputs. By performing various digital waveform functions (addition, subtraction, time shifting, and the like), noise and disturbances that affect at least some of the plurality of inputs can be detected and removed. Additionally, due to the very high sample rate, filtering the signal well above its cycle rate (e.g. 4 KHz) results in a sampled signal that eliminates high frequency components from the sampled digital data. Therefore signal noise near the sample rate (e.g. 150 KHz) is filtered out before the signal is sampled. Using these and other well known techniques, signals received from rotors, stators, excitation sources, and other signals related to synchro/resolver applications and simulations are digitally stored and processed by the platform resulting in very high accuracy position detection and simulation reproduction.

A digital sample of the gain adjusted input signal 408 is evaluated by the zero-cross detection facility 418. The zero-cross detection facility 418 may include several software programmable configuration options, such as zero level, enable zero-cross detection, number of samples to average for the purposes of detecting the input signal 408 had crossed the programmed zero level, direction of zero-cross detection, zero-cross source (input or output signal), enable auto-zero functionality, input signal (A, B, C, D) to detect zero-crossing, and other options associated with detecting a zero crossing. Zero-cross facility 418 may provide a zero signal 422 indicative of a when the evaluated signal crosses the programmed zero level. The zero signal 422 may facilitate notifying other elements of the platform 100 of a zero crossing event. A zero-cross count facility 424 may determine information related to one or more zero crossing events. In an example the zero-cross count facility 424 may track an interval between zero crossing events. The interval between zero crossing events may be based on a reference clock, such as a 33 MHz base clock, and the interval may be a count of the reference clocks between zero crossings.

The digital samples from each of the analog to digital converter facilities 410 may also be applied to a moving sum facility 420, wherein a running average of the digital samples may be calculated. Each sample from each of the inputs may be included in the running average. A phase delay function 440 may provide control input to the moving sum facility 420 to account for phase differences among the inputs. In an example, a phase difference between an excitation signal and stator output signals may be measured by differences in the digital samples of each signal. The resulting difference may be used to determine a control or adjustment to align the samples that are summed by the moving sum facility 420. The running average of samples may be provided to a tangent function 428 for computing various angular functions related to the inputs.

Tangent function 428 may receive sampled input data from each of the analog to digital converters 410 as well as the running average from the moving sum facility 420. The tangent function 428 may perform computations of at least the inputs and the computations may be based on a software programmable option or command that controls at least a portion of the tangent function 428. In an example, the tangent function 428 may calculate a tangent depending on the current angle determined from the input A, B, C, and D. The resultant of the tangent function 428 may be passed to an angle restore function 430 where programmed logic may restore the angle and calculate synchro/resolver acceleration.

Synchro angle restore function 430 may include an angle computation that may begin with a cosine computation, such as for 240 degrees phase and 0 degrees phase conditions. After cosine conversion, additional angle related calculations may be performed. Computations may be executed using an all-integer arctangent algorithm that allows accurate angle position detection based on integer only arithmetic. In an embodiment, calculations may include the following polynomial conversion that represents the basic function ATAN (ABS(SIN/COS)):

$$.0318159928972 * y + .950551425796 +$$
$$3.86835495723 / (y + 8.05475522951 + 39.4241153441 /$$
$$(y - 2.08140771798 - .277672591210 / (y - 8.27402153865 +$$
$$95.3157060344 / (y + 10.5910515515))))$$

where y=2*x−1 and x is tangent of the target angle and x in [0,1].

Although the selected polynomial may only directly recover angles in the range of 0 degrees to 45 degrees, it can be used as a base for very efficient and fast computations of other angles. An arctangent recovery method that uses the selected polynomial method may provide unique benefits in that it facilitates direct calculation of any angle by extending the use of the base polynomial to a full 360 degrees without requiring lookup tables that require greater processing speed and/or much more data storage. The following chart shows how the base polynomial is applied to calculate different angles by applying an appropriate recovery factor to the polynomial. The recovery factor applied to the polynomial is based at least on conditions associated with the angle. In the chart below, the conditions include only the sign of the sine (Sin) and cosine (Cos) and their relative absolute values. By evaluating these simple conditions, the arctangent recovery algorithm (that comprises the base polynomial and a recovery factor) can be quickly computed. In embodiments, the base polynomial can be calculated independently of the recovery factor conditions and the resultant of the base polynomial calculated can be adjusted by the recovery factor.

| Angle (degrees) | Conditions | | | Arctangent recovery |
|---|---|---|---|---|
| 0 . . . 45 | Sin > 0 | Cos > 0 | \|Sin\| <= \|Cos\| | ATAN(ABS(SIN/COS)) |
| 45 . . . 90 | Sin > 0 | Cos > 0 | \|Sin\| > \|Cos\| | PI( )/2 − ATAN(ABS(COS/SIN)) |
| 90 . . . 135 | Sin > 0 | Cos < 0 | \|Sin\| > \|Cos\| | PI( )/2 + ATAN(ABS(COS/SIN)) |
| 135 . . . 180 | Sin >= 0 | Cos =< 0 | \|Sin\| <= \|Cos\| | PI( ) − ATAN(ABS(SIN/COS)) |
| 180 . . . 225 | Sin < 0 | Cos < 0 | \|Sin\| <= \|Cos\| | PI( ) + ATAN(ABS(SIN/COS)) |
| 225 . . . 270 | Sin < 0 | Cos < 0 | \|Sin\| > \|Cos\| | 3*PI( )/2 − ATAN(ABS(COS/SIN)) |
| 270 . . . 315 | Sin < 0 | Cos > 0 | \|Sin\| > \|Cos\| | 3*PI( )/2 + ATAN(ABS(COS/SIN)) |
| 315-360 | Sin < 0 | Cos > 0 | \|Sin\| <= \|Cos\| | 2*PI( ) − ATAN(ABS(SIN/COS)) |

In embodiments, the computations to recover the angle using angle restore function 430 may provide a low error angle. In an example maximum error of the recovered angle is approximately 4 arcsec when computed using a 16-bit scaling coefficient and 32-bit arithmetic. In another example, maximum error may be approximately 1 arcmin using a 13-bit scaling coefficient and 24-bit arithmetic.

The tangent function 428 may generate resultant data that may be stored, at least temporarily, in a FIFO memory 434. The FIFO memory 434 may include sample time stamp data, raw sample value data, calibrated value data, averaged position, Sa/Sb/Sc/Sd, raw ADC 410 output data, and the like. The FIFO memory 434 may be accessed by a host computer or controller over the bus 108 through the base layer 104 if needed.

Interrupt function 444 may process data received from one or more of the tangent facility 428, restore angle function 430, and FIFO 434 to determine status of the angular position of the synchro and/or resolver. Determining status may include comparing received data to one or more thresholds such as a maximum position, a minimum position, maximum acceleration, loss of traction, and the like. Each of the thresholds or comparison values may be software programmable. Additionally, the interrupt function 444 may be software programmed to select the inputs to process, the data types being provided in the inputs, and the like. In an example, software programmability of the interrupt function 444 may be beneficial in that detecting a position for raw tangent function 428 data values may involve different processing than detecting acceleration. Because acceleration is continuously being measured, not only can it be a condition for status related actions, but the measurement may facilitate anticipating loss of friction and thereby provide feedback to a control system that may take action to prevent loss of traction.

Input interrupt function 444 to generate an interrupt signal that may be detectable through the bus 108 by software running on the controller and/or a host computer. Software processing of the interrupt signal may include reading data from the FIFO memory 434, adjusting values of one or more software programmable options, features, and registers of the digital position detection and simulation platform, and the like. Interrupts may also be generated based on status, such as for example; calibrated data being ready in the FIFO 434, the FIFO 434 being empty, above a threshold, FIFO full, position above a maximum or other reference position value, acceleration above a maximum, position below a minimum or other low reference value, within a range, and the like.

Figure 5:
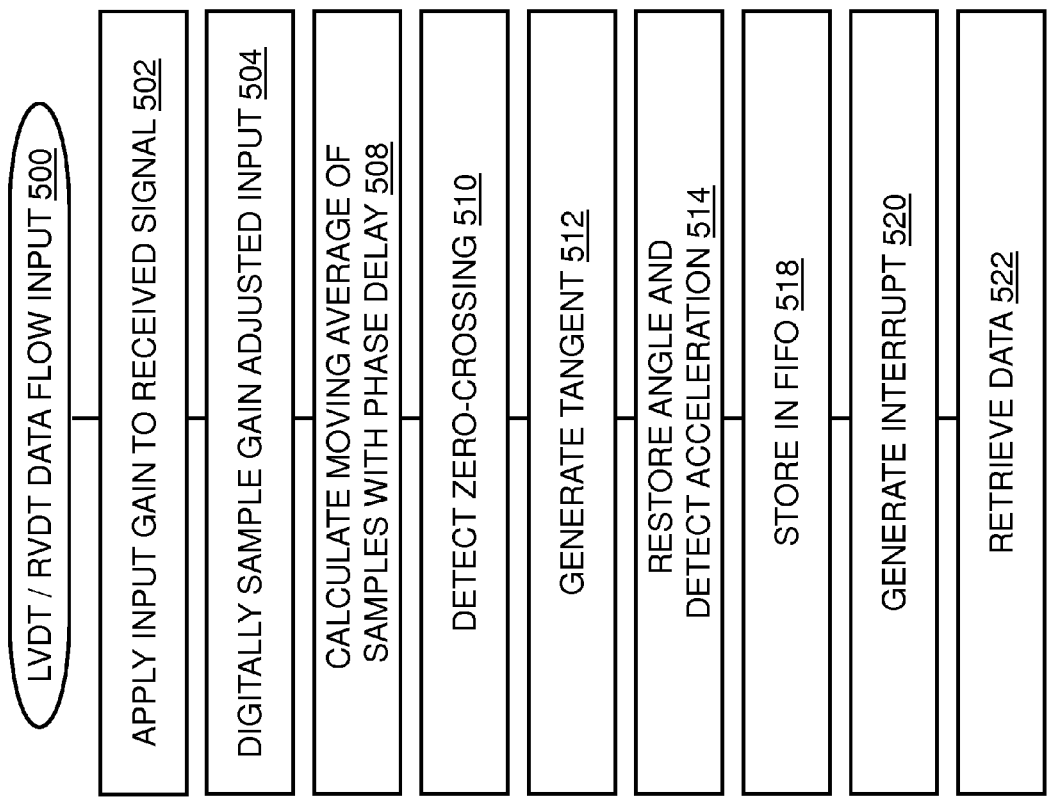
FIG. 5 depicts an input data flow chart for the embodiment of FIG. 4.

Referring to FIG. 5, an input data flow chart for an embodiment of the input functionality described above and depicted in FIG. 4, synchro/resolver data flow 500 may include receiving synchro/resolver output signals in step 502 and applying an input gain to each received signal. Following step 502, step 504 may result in the gain adjusted received input signals being digitally sampled. In step 508 a moving average of all of the digitally sampled input signals may be calculated. The moving average calculation in step 508 may include a phase delay component to facilitate adjusting for phase differences among the digitally sampled inputs. Step 510, which may be performed in parallel with step 508, may result in detecting a zero-crossing of the synchro/resolver signals. After steps 508 and 510, step 512 may generate a tangent resultant based on a determined angle or angular position of the inputs. The resultant is further processed at step 514 where the determined angle may be restored and an acceleration of the inputs may be determined. In step 518, the data processed in step 512 may be stored in a FIFO or similar memory from which it may be accessed and processed as in step 520 to detect a position or acceleration of the synchro/resolver relative to one or more thresholds. Also in step 520, one or more interrupts may be generated based on computations related to the position, the FIFO status, zero crossing, acceleration, and the like. The synchro/resolver input data flow may conclude with a variety of data associated with the data flow being retrieved from the FIFO at step 522.

Figure 6:
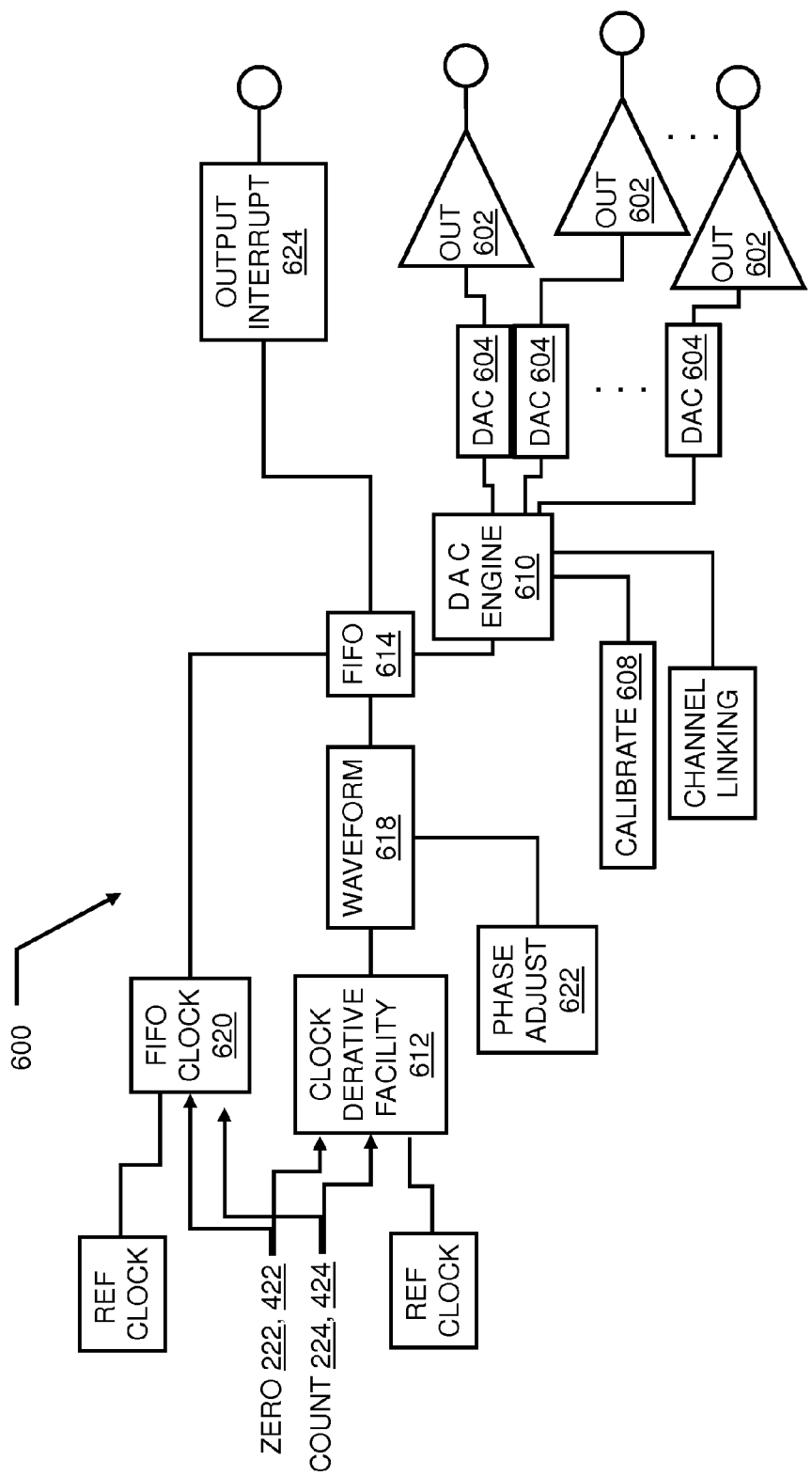
FIG. 6. depicts a schematic diagram of an output portion of the platform.

The platform may include various input configurations as described in FIGS. 2-5 for receiving signals associated with synchros, resolvers, LVDTs, and RVDTs, in operational, test, simulation, or combination modes. The platform 100 may also include one or more output configurations for driving a plurality of output signals including driving simulation signals based on the application objectives. FIG. 6 depicts an exemplary output stage 600 of the platform. The output stage 600 may support programmability to adjust the operation, functions, features, performance, and logical configuration of elements in and outputs provided by the output stage 600. The output stage 600 may be programmed and/or configured using software, such as software 114.

Output stage 600 may provide data to one or more of outputs 602 based on one or more clock sources. The output stage 600 may also process the one or more clock sources, such as to generate clocks that have configurable relative phase relationships for two or more of the outputs 602. Each output 602 generated by the output stage 600 may be independently clocked, groups of outputs 602 may be commonly clocked, each output 602 may be clocked based off of a common clock source that may be processed differently for each output 602, and other combinations of clock sources, processed clocks, externally clocked sources, and the like may be applied to one or more outputs. Output clock sources may include a reference sources, such as a locally generated 24 MHz or 33 MHz clock, an externally provided clock, a clock derived from one or more input stage signals from FIG. 2 or 4, including Zero (222, 424) and/or Count (224, 424), and the like. A derived clock may be an automatically detected and processed to divide the 24 or 33 MHz reference clock based on the period measurement represented by the Zero and/or Count signals that are provided by the analog input subsystem. The derived clock may be produced by a clock derivative facility 612, such as a phase lock loop type circuit. An output clock may also be software generated. Software executing on a processor or controller may cause the output clock to change state directly under software control. In this way output signals may be clocked based on a variety of clock sources, relationships, and the like to meet application specifications and needs.

A signal for each output 602 may be generated by a Digital to Analog Converter (DAC) 604. In an exemplary embodiment, quad DAC AD5664 from Analog Devices Corporation may provide analog signals for up to four outputs 602. Each output 602 may include dedicated software configurable offset and gain registers, depicted by element 608 "CALIBRATE" in FIG. 6. In an example, an offset register associated with an output 602 may be programmed and used as a 16-bit twos-compliment integer. In the example, a gain register may be programmed and used as a 16-bit integer that facilitates adjusting output gain from approximately 0 to approximately 2. In this example, when the gain register is programmed with a value of 0, the gain is approximately 0 and the output signal will be approximately 0. Further in this example, when the gain register is programmed with 0x7FFF (or optionally 0x8000), the gain is approximately 1 or unity gain. When the gain register is programmed to 0xFFFF, the gain is approximately 2 or twice what it is when the gain register is programmed with 0x7FFF or 0x8000.

Continuing to refer to FIG. 6, DAC engine 610 provides output configuration and control features such as a state machine that may check for an over/under condition against a valid range for value programmed into the calibration offset and gain registers 608. When an over condition is detected, the gain or offset registers provide 0xFFFF to the DAC and when an under condition is detected, the gain or offset registers provide a 0x0000 value. This may ensure that the DAC is not improperly operated which may cause damage to the device, damage to a connected device, distorted output signals, and other undesired defects and/or errors such as phase reversion. This results in a more stable and reliably operating system under unexpected conditions. Additionally, the platform 100 may include DAC power consumption circuits that provide a signal when a DAC power consumption exceeds a threshold. In embodiments, a circuit that may provide monitoring and threshold signaling includes a series resistor in the DAC power line that is paralleled with an LED or optocoupler that transmits light when the current draw of the DAC generates a voltage across the series resistor that exceeds the turn on voltage for the LED/optocoupler. The LED output can be monitored by an optical sensor to generate a logic signal that can be used to generate an interrupt.

The output stage 600 may be configured so that two of the outputs 602 may be linked to provide an output signal that has a maximum voltage range that is twice that of a single output 602 (e.g. a double-span differential output). In this way, the output stage 600 offers performance flexibility and features that may be needed to comply with any of a synchro, resolver, LVDT, RVDT, or simulation application. By connecting two outputs 602 in series, the resulting linked output can generate voltages twice that of either of the two linked outputs if operated individually. In an example the output stage 600 may include four outputs: 0, 1, 2, 3. In the example, outputs 0-1 and 2-3 may be linked. In addition to providing features to facilitate linking outputs 602, the output stage 600 may include alternate gain registers that may provide gain control to two or more outputs 602. In an embodiment that includes one or more of the alternate gain registers, programming the alternate gain registers to 0x8000 will result in the alternate gain register effectively being disabled by providing unity gain to the two associated outputs 602.

Output DACs 608 may receive digital data to be converted from a variety of sources associated with the output stage 600 including, without limitation: a direct write register, a direct output register, an output FIFO 614, a waveform generation facility 618, and various combinations of these sources. There may be one or more than one of each of the aforementioned digital data sources for each of the outputs 602. Any of the digital data sources may be shared among two or more of the DACs 608. The direct write register(s) may facilitate providing a digital value to each of the DACs 608. The direct write register may facilitate providing the data simultaneously to each DAC 608. In an example, the direct write registers may be 32 bit registers. Bits 0 through 15 of the register may be configured to be provided to each of the DACs 608 for conversion to an analog output. Bits 0 through 15 may be transferred to each DAC simultaneously when bit 31 is written to a logical value of 1. In this way bit 31 may be used as a signal to update all of the DACs 608. The direct output register may allow software programming of a digital value that is provided directly to the DAC 608 for conversion to an analog signal. In an embodiment, the direct output register is a 22 bit register.

Output FIFO 614 may temporarily store data that may affect the output 602. The data temporarily stored in the FIFO 614 may include digital data for conversion to an analog signal, simulation commands, and the like. Data in the FIFO 614 may be sequenced out to the DAC 608 based on a FIFO clock that is provided by a FIFO Clock facility 620. The FIFO clock facility 620 may provide a clock to the FIFO 614 that is derived from one or more inputs that may include an internal reference clock, an externally supplied clock, the signals Zero (222, 422) and Count (422, 424). The FIFO clock facility 620 may be configured by software that may be used to select the clock source, the mode of generating the FIFO clock, and the like. The FIFO 614 may alternatively be clocked by using software to access a FIFO clock register. In an example, the internal reference clock may be a derivative of a 24 MHz or a 33 MHz clock reference available to various elements of the platform 100. The externally supplied clock that is input to the FIFO clock facility 620 may be received by the platform 100 through a different interface connection than the externally supplied clock that is input to the clock derivative facility 612. The FIFO 614 may operate as a first-in-first-out memory. In an example, the FIFO 614 may include 256 memory locations. The FIFO clock and the DAC clock may be synchronized so that data stored in the FIFO is delivered to the direct output register in proper phase with the DAC clock so that the DAC 608 converts a new FIFO data value with each DAC clock event.

In embodiments, the FIFO 614 may include a plurality of separate channels that may be separately clocked. The separate channels may include a channel for waveform data and a channel for conversion control data. Conversion control data may include gain control, phase control, offset control, and the like. While the waveform data channel may be clocked at a rate that provides an accurate representation of a simulation or excitation waveform, the control data channel may be clocked at a different rate, such as a rate equal to a single cycle of the desired signal. In this way control of the conversion by the conversion data can be adjusted as desired independently of or synchronized with the waveform data FIFO. In an example, offset control data in a conversion control data FIFO channel may be changed at the start of an output waveform cycle. The offset change may be synchronized with the output waveform cycle so that the offset change occurs when the output waveform is at a zero voltage output, thereby allowing the offset to be changed without inappropriately disrupting the generated waveform. Alternatively, a plurality of FIFOs 614 may be used to provide waveform data and control. Waveform data may be accessed in one of the plurality of FIFOs 614 and control data may be accessed in another of the plurality of FIFOs 614. Each FIFO may be separately clocked as described above for separately clocking channels of a FIFO.

The waveform generation facility 618 may facilitate providing pre-loaded waveforms for digitization and output. The pre-loaded waveforms may be used to generate outputs for linked outputs as herein described. Any two sets of linked outputs (e.g. linked outputs 0-1 and 2-3) may have a relative phase offset. The relative phase offset may be derived from a phase adjust facility 622 and may be represented as an index in the pre-loaded waveform. Additionally, certain configurations can begin sequencing the pre-loaded waveform from the index based on an event, such as an input signal zero crossing event. Software may facilitate configuring the waveform generation facility 618 to support indexing, time delay, combinations of indexing and time delay, and the like. In an example of combining indexing and time delay, a pre-loaded waveform may hold 256 samples and time delay may be configurable in 1 uS increments. The phase adjust facility 622 may apply a received or specified index offset of 6 samples and a time delay of 14 us so that the waveform cycle may begin a total of 6 sample clocks plus 14 us after an excitation input zero crossing is detected. The waveform generation facility

618 may be clocked by the clock derivative facility 612 as herein described. Clock sources that may be used to provide a clock to the waveform generation facility 618 may include software access, 24 MHz or 33 MHz, a derivation of 24 MHz or 33 MHz, an externally provides clock, an auto-detected clock, and the like. In an example of auto-detected clock operation, each zero-crossing event on an input to the platform 100 may cause the waveform to be restarted at its index.

The waveform generation facility 618 and the FIFO 614 may be operated in a coordinated manner, such as during simulation operation. When operated in a coordinated manner, waveform generation facility 618 output data may be directed to the DAC direct output register, whereas the FIFO 614 outputs may be directed to the offset and gain calibration 608 registers. As a result, a change in phase or gain of an affected output may take place in an automated and coordinated manner so that each new data from the waveform generation facility 618 may be associated with a new gain and/or offset to be converted by the DAC 608. Optionally, the data in the FIFO that is directed to the offset and gain calibration 608 registers, may be held so that any change associated with the data is delayed until the index of the output waveform is equal to zero.

The phase-adjust facility 622 may also facilitate determining and maintaining a desired phase relationship between: two sets of linked outputs, an output or linked output pair and an input to the platform 100, and other combinations of inputs and outputs The phase-adjust facility 622 may also help with maintaining a preconfigured phase delay based on a count of microseconds. In an embodiment, phase-adjust facility 622 may provide a time based phase delay up to 250 ms).

The output stage 600 may also include an interrupt capability that may be provided by an interrupt facility 624 that provides an interrupt to a system component such as a controller or other device associated with the platform 100. In an example, the interrupt facility 624 may generate an interrupt signal based on a status of the FIFO memory, such as FIFO empty, FIFO full, and FIFO half full.

Figure 7:
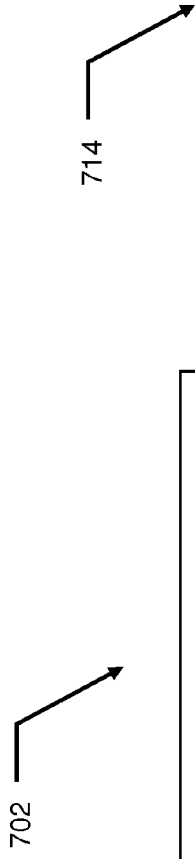
FIG. 7 depicts a platform memory map.

FIG. 7 depicts two different software addressing schemes for the platform 100. While two different schemes are depicted, any other addressing scheme may be used to address the platform 100. Addressing techniques may include direct, indirect, relative, absolute, and any other technique . . . . The following addressing schemes, register addresses, register offsets, register values, register definitions, dependencies on data in a plurality of registers, coding, and other aspects of configuring, addressing, and accessing the platform are only for illustrative example and are not meant to be limiting.

A four-channel embodiment of an LVDT/RVDT map 702 configuration includes a reserved area 704 for registers that are common for all channels or are independent of channel designation, four analog input address spaces 708, four analog output address spaces 710, and an analog output waveform address space 712. A two-channel embodiment of a synchro/resolver map 714 configuration includes a reserved area 704 for registers that are common for all channels or are independent of channel designation, two analog input address spaces 718, two analog output address spaces 720, reserved address spaces 722, and an analog output waveform address space 724.

Each analog input channel in the analog input address space 708 may include a plurality of registers to enable various features, functions, and operation of an input stage for an LVDT/RVDT configuration such as that depicted by FIG. 2, or other configurations, all of which are included in the scope of this disclosure. The following table of registers is exemplary of such a plurality of registers.

Table of LVDT/RVDT analog input registers.

| Register address | Read access | Write Access | Note | Reset state |
|---|---|---|---|---|
| +0x00 | AIN_CFG | AIN_CFG | AIn Configuration, used to select clock source, FIFO mode, averaging, gain, zero crossing source (AIn/AOut) and some other AIn settings | 0x0 |
| +0x04 | AIN_STS | | Status, replicates current "sticky" state of the interrupt request sources and some extra status bits | 0x0 |
| +0x08 | AIN_ZL | AIN_ZL | Zero level, 16LSBs, set level of the expected mid-scale voltage for the signal that is applied at the ADCA path. When read, return current value of the zero level used in the zero detector (pre-set or auto-calculated) | 0x0 |
| +0x0C | | AIN_SE | Se, signed 24-bit, 24LSBs, used as a constant in 4-wire mode | 0x0 |
| +0x10 | AIN_SA | | Sa, signed or unsigned, depending on the mode/wiring scheme selected 24-bit, 24LSBs, updated every ½ period | 0x0 |
| +0x14 | AIN_SB | | Sb, signed or unsigned, depending on the mode/wiring scheme selected, 24-bit, 24LSBs, updated every ½ period | 0x0 |
| +0x18 | | AIN_OFFS | 24-bit signed offset to be applied to (Sa − Sb)/(Sa + Sb), twos-compliment | 0x0 |
| +0x20 | | AIN_GAIN | 24-bit unsigned scaling factor for the ALU output 0x0 = 0, 0x800000 = 1 | 0x0 |
| +0x24 | AIN_RAW | | Non-scaled 24-bit signed or unsigned fractional ALU output - current position. Result is signed if Sa or Sb or Se is signed in the current mode selected by the configuration | 0x0 |
| +0x28 | AIN_CAL | | Scaled 24-bit signed or unsigned fractional part, current calibrated position. Result is signed if Sa or Sb or Se is | 0x0 |

Table of LVDT/RVDT analog input registers.

| Register address | Read access | Write Access | Note | Reset state |
|---|---|---|---|---|
| | | | signed in the current mode selected by the configuration | |
| +0x2C | | AIN_MIN | 24-bit signed minimum position, used by position detector | 0x0 |
| +0x30 | | AIN_MAX | 24-bit signed maximum position, used by position detector | 0x0 |
| +0x34 | | AIN_P1 | 24-bit signed position P1, used by position detector | 0x0 |
| +0x38 | | AIN_P2 | 24-bit signed position P2, used by position detector | 0x0 |
| +0x3C | | AIN_IER | Interrupt enable register, selects interrupt sources that should be enabled | 0x0 |
| +0x40 | AIN_ISR | | Interrupt status register, reports currently pending IRQ sources | 0x0 |
| +0x44 | | AIN_ICR | Interrupt clear register, used to clear pending IRQs | 0x0 |
| +0x48 | AIN_FDR | | FIFO data register, 32-bit, format varies depending on the selected configuration | 0x0 |
| +0x4C | | AIN_FCR | FIFO count register, reports number of occupied samples in 256-sample AIn FIFO | 0x0 |
| +0x50 | | AIN_FWM | FIFO Watermark level, used to generate IRQ | 0x0 |
| +0x54 | AIN_ZC0 | | Interval between zero crossings - even, based on 33 MHz base frequency | 0x0 |
| +0x58 | AIN_ZC1 | | Interval between zero crossings - odd, based on 33 MHz base frequency | 0x0 |
| +0x5C | AINA_LV | | Last value delivered by the AIN A A/D, after AINA_OFFS and AINA_GAIN were applied, straight binary | 0x0 |
| +0x60 | AINB_LV | | Last value delivered by the AIN B A/D, after AINA_OFFS and AINA_GAIN were applied, straight binary | 0x0 |
| +0x64 | AIN_CLK | AIN_DIV | Divider for the 24/33 MHz clock - AIn rate, on read- Software clock for the AIn | 0x0 |
| +0x6C | | AINA_OFFS | Offset applied to the AIn A, 16LSBs (twos-compliment) | 0x0 |
| +0x70 | | AINA_GAIN | Gain applied to the AIn A (0x0 = 0, 0x8000 = 1) | 0x0 |
| +0x74 | | AINB_OFFS | Offset applied to the AIn B | 0x0 |
| +0x78 | | AINB_GAIN | Gain applied to the AIn B | 0x0 |
| +0x7C | AINA_MAX | | Maximum/Minimum value at the "A" | 0x0 |
| +0x80 | AINA_MIN | | channel during the last detected period of the waveform. Valid only if periodic signal is applied to the detector input or external zero-cross detector is used | 0x0 |
| +0x84 | AINB_MAX | | Maximum/minimum value at the "B" channel during the last detected period of the waveform. Valid only if periodic signal is applied to the detector input or external zero-cross detector is used | 0x0 |
| +0x88 | AINB_MIN | | | 0x0 |

The analog input registers may include an input configuration register, an input status register, an input interrupt source register, and others described herein.

The following tables represent an embodiment of each of the input configuration, input status, and input interrupt registers.

| | Input configuration register: | | |
|---|---|---|---|
| Bit | Name | Description | Reset state |
| 31 | AIN_CFG_ZE | 1-use internal zero crossing detector<br>0-use zero crossing from AOUT | 0 |
| 30 | AIN_CFG_UAZ | 1 - Use "Auto-zero" feature. Auto-zero detects zero level as (Max-Min)/2 for the last period but only accepts resulting values from 0x7000 to 0x9000 and used 0x8000 if result is outside of the range. Auto zero feature allows to eliminate DC offset but may cause oscillations on the readings if signal is changing too fast, when auto- | |

| | | Input configuration register: | |
|---|---|---|---|
| Bit | Name | Description | Reset state |
| 29 | AIN_CFG_UCP | zero is selected zero-crossing is done using the waveform with the highest p-p amplitude. Auto-zero automatically selects input with highest amplitude for the zero crossing detection unless UZB is set to 1.<br>1-use calibrated position for the detector<br>0-use raw position<br>Detector can generate interrupts based on the current position | 0 |
| 28-27 | AIN_CFG_SE | Two bits set mode for the divider:<br>0 - (Sa − Sb)/(Sa + Sb)<br>1 - Use Sa/Se for the position detection Se should be loaded to the AI_254_SE register, this mode works only to 90 degrees or less movements that do not cross zero.<br>2 - Use (signed)Sa/(signed)Sb for the position detection<br>3 - - Use (signed)Sa/(signed)Se for the position detection | 0 |
| 26 | AIN_CFG_UZB | =1 - use "B" for the zero-crossing detection. For example reference waveform may be re-routed back to "B" input | 0 |
| 25-24 | AIN_CFG_CLKx | Clock for the AIn ADC<br>0 - Software clock<br>1 - 33 MHz<br>2 - 24 MHz<br>3 - CLI CVCLK | 0 |
| 23 | AIN_CFG_PTM | =1 - pass-through mode, zero detector is disabled and data from A and B assumed to be result of the tracking ALU output, 16MSBs occupied by the "A" data and 16LSBs by "B" data | 0 |
| 22 | AIN_CFG_FST | =1 store timestamp into FIFO | 0 |
| 21 | AIN_CFG_FSA | =1 store Sa to the output FIFO<br>(works if DCx = 0 and PTM = 0) | 0 |
| 20 | AIN_CFG_FSB | =1 store Sb to the output FIFO<br>(works if DCx = 0 and PTM = 0) | 0 |
| 19 | AIN_CFG_FSC | =1 store calibrated ALU output to the output FIFO<br>(if DCx <> 0, store averaged value) | 0 |
| 18 | AIN_CFG_FSR | =1 store raw ALU output to the output FIFO<br>(works if DCx = 0 and PTM = 0) | 0 |
| 17 | AIN_CFG_ZLH | =1 enable low-->high zero crossing detection, setting this bit enables (Sa − Sb)/Sa + Sb) calculation for every negative ½ period | 0 |
| 16 | AIN_CFG_ZHL | =1 enable high-->low zero crossing detection, setting this bit enables (Sa − Sb)/Sa + Sb) calculation for every positive ½ period | 0 |
| 15-12 | AIN_CFG_DCx | 4-bit decimation/averaging code for the output<br>0 = 1, 1 = 2, 2 = 4, . . . , F = 65536 | 0 |
| 11-8 | RSV11_8 | Reserved | 0 |
| 7-6 | AIN_CFG_GBx | Gain code for the "B" channel<br>00 = 1, other 3 gains are PGA-dependent | 0 |
| 5-4 | AIN_CFG_GAx | Gain code for the "A" channel<br>00 = 1, other 3 gains are PGA-dependent | 0 |
| 3-0 | AIN_CFG_ZCx | 4-bit zero crossing code, # of samples that is averaged in order to detect zero crossing:<br>0 = 1, 1 = 2, 2 = 4, 3 = 8, 4 = 16, 5 = 32, 6 = 64, 7 = 128, 8 = 256 | 0 |

| | | Input status register: | |
|---|---|---|---|
| Bit | Name | Description | Reset state |
| 18 | AIN_STS_ZLH | Rising edge zero crossing was detected | 0 |
| 17 | AIN_STS_ZHL | Falling edge zero crossing was detected | 0 |
| 16 | AIN_STS_ABD | "A" and "B" data is ready | 0 |
| 15-0 | AIN_STS_IRQ | Mirrors corresponding IRQ bits | 0 |

| | | Input Interrupt Source Register: | |
|---|---|---|---|
| Bit | Name | Description | Reset state |
| 15 | AIN_CDR | Calibrated data ready | |
| 14 | AIN_FE | FIFO empty | |
| 13 | AIN_FHF | FIFO half full | |
| 12 | AIN_FF | FIFO full | |
| 11 | AIN_GEM | Calibrated value >= Max | |
| 10 | AIN_LEM | Calibrated value <= Min | |
| 9 | AIN_GE1 | Calibrated value >= POS1 | |

| Input Interrupt Source Register: | | | |
|---|---|---|---|
| Bit | Name | Description | Reset state |
| 8 | AIN_EQ1 | Calibrated value = POS1 | |
| 7 | AIN_LE1 | Calibrated value <= POS1 | |
| 6 | AIN_GE2 | Calibrated value >= POS2 | |
| 5 | AIN_EQ2 | Calibrated value = POS2 | |
| 4 | AIN_LE2 | Calibrated value <= POS2 | |
| 3 | AIN_DZ | Error - division by zero (Se = 0) | |
| 2 | AIN_OR | Error - overrange in ALU | |
| 1 | AIN_OF | Error - overflow in ALU | |
| 0 | AIN_OG | Error - overgain in ALU | |

The platform may include a layer control and configuration register which may be used to set common settings such as the on/off state of a status LED. An Isolated Side TX Register (ISTR) may be used to access digital output bits, reset individual blocks on the platform and switch zero crossing debug mode On/Off. An Isolated Side RX Register (ISDR) may be used to provide the current state of digital inputs. An interrupt register may be used to enable and monitor interrupts generated by the platform. The following table shows exemplary embodiments of the function and description of each of these registers.

| Layer Control Register: | | | |
|---|---|---|---|
| Bit | Name | Description | Reset state |
| 1 | LCR_LED | Enable (turn-on)/ Disable (turn-off) status LED. 1 in this bit turn on status LED. | 0 |
| 0 | DCDIS | =1 - disable all DC/DCs that are powering the attachments | 0 |

| ISTR Control Register: | | | |
|---|---|---|---|
| Bit | Name | Description | Reset state |
| 21-20 | AO_CH | Select analog output channel number for the waveform download (waveform memory page selector) | 0 |

| ISTR Control Register: | | | |
|---|---|---|---|
| Bit | Name | Description | Reset state |
| 16 | DBG_ZC | 1 = Debug Zero crossings - DO[3: 0] will indicate AIn zero crossing detection and DO[7: 4] AOut zero crossings | 0 |
| 15-12 | RST_AOx | 1 = Reset analog output block on corresponding channel | 0 |
| 11-8 | RST_AIx | 1 = Reset analog input block on corresponding channel | 0 |
| 7-0 | DOUTx | Digital Output bits 7-0 {CH3_DO1, CH3_DO0 . . . CH0_DO0} | 0 |

| ISDR Control Register: | | | |
|---|---|---|---|
| Bit | Name | Description | Reset state |
| 7-0 | DINx | Digital Input bits 7-0 {CH3_DI1, CH3_DI0 . . . CH0_DI0} | 0 |

| Interrupt Control Register: | | | |
|---|---|---|---|
| Bit | Name | Description | Reset state |
| 31-16 | RSV | Standard IRQ Sources (See IER/IMR/ISR/ICR description) | 0 |
| 15-8 | RSV15_8 | Reserved | 0 |
| 7 | IR_AO3 | Interrupt from AOut @ channel 3 | 0 |
| 6 | IR_AO2 | Interrupt from AOut @ channel 2 | 0 |
| 5 | IR_AO1 | Interrupt from AOut @ channel 1 | 0 |
| 4 | IR_AO0 | Interrupt from AOut @ channel 0 | 0 |
| 3 | IR_AI3 | Interrupt from AIn @ channel 3 | 0 |
| 2 | IR_AI2 | Interrupt from AIn @ channel 2 | 0 |
| 1 | IR_AI1 | Interrupt from AIn @ channel 1 | 0 |
| 0 | IR_AI0 | Interrupt from AIn @ channel 0 | 0 |

Each analog out channel in the analog out address space 710 may include a plurality of registers to enable various features, functions, and operation of an output stage for an LVDT/RVDT configuration such as that depicted by FIG. 6. The following table of registers is exemplary of such a plurality of registers.

| Table of LVDT/RVDT analog output registers. | | | | |
|---|---|---|---|---|
| Register address | Read access | Write Access | Note | Reset state |
| 16'h00, | AOUT_CFG | AOUT_CFG | Configuration, used to select clock source for the FIFO and Waveform Generator, enable output buffers, control FIFO mode and Waveform output channels | 0x0 |
| 16'h04, | AOUT_STS | | Status - reports when channel(s) were updated (in Direct Write mode) | 0x0 |
| 16'h08, | | AOUT_DW0 | Write to the AOut0-3, 16LSBs represent analog output data + bit 31 is "Update all" bit | 0x0 |
| 16'h0C, | | AOUT_DW1 | | 0x0 |
| 16'h10, | | AOUT_DW2 | | 0x0 |
| 16'h14, | | AOUT_DW3 | | 0x0 |
| 16'h18, | | AOUT_OFFS0 | Calibration Offset applied to the AOut 0-3, 16LSBs (twos-compliment) | 0x0 |
| 16'h1C, | | AOUT_OFFS1 | | 0x0 |
| 16'h20, | | AOUT_OFFS2 | | 0x0 |
| 16'h24, | | AOUT_OFFS3 | | 0x0 |
| 16'h28, | | AOUT_GAIN0 | Gain applied to the AIn A (0x0 = 0, 0x8000 = 1) | 0x0 |
| 16'h2C, | | AOUT_GAIN1 | | 0x0 |
| 16'h30, | | AOUT_GAIN2 | | 0x0 |

Table of LVDT/RVDT analog output registers.

| Register address | Read access | Write Access | Note | Reset state |
|---|---|---|---|---|
| 16'h34, | | AOUT_GAIN3 | | 0x0 |
| 16'h3C, | AOUT_WCLK | AOUT_WDIV | Divider for the 24/33 MHz clock - Waveform rate. Read - Software clock for the Waveform | 0x0 |
| 16'h40, | | AOUT_PHA | Phase of the AOut0-1/2-3. Bits 27:18 define offset within output waveform in samples and 17:0 define delay before first sample is outputted (in uS, 0.262 sec max) bits 31:28 are reserved (should be 0 s) | 0x0 |
| 16'h44, | | AOUT_PHB | | 0x0 |
| 16'h48, | | AOUT_GAINA | Gain may be applied to DACs pairs simultaneously by adjusting values in GAINA/B registers, DAC engine automatically prevent output from the phase reversal as a result of the gain. Gain applied to AOuts (0x0 = 0, 0x8000 = 1) | 0x0 |
| 16'h4C, | | AOUT_GAINB | | 0x0 |
| 16'h5C, | | AOUT_WCNT | # index of the last sample (starting from 0) loaded to the waveform (wraparound limit for the waveform generation - used to set number of actual samples in the waveform) | 0x0 |
| 16'h60, | | AOUT_NDIV | # of bits that is needed shift divider for the digital PLL (used when "auto" clock source is selected and WCNT should be loaded with value that is power of 2 only) 1 = 2, 2 = 4, 4 = 8, etc | 0x0 |
| 16'h64, | | AOUT_DW | Direct write to the DAC, 22 LSBs are directly translated to the AD5664, offset = 0 and Gain = 0x8000 | 0x0 |
| 16'h68, | | AOUT_IER | Interrupt enable register | 0x0 |
| 16'h6C, | AOUT_ISR | | Interrupt status register | 0x0 |
| 16'h70, | | AOUT_ICR | Interrupt clear register | |
| 16'h80, | AOUT_FCLK | AOUT_FDIV | Divider for the FIFO 24/33 MHz clock Software clock for the FIFO | |
| 16'h84, | | AOUT_FDR | FIFO data register, 32-bit, format varies | |
| 16'h88, | AOUT_FCR | | FIFO count register | |
| 16'h8C, | | AOUT_FWM | FIFO Watermark level | |

The platform 100 may include analog output registers associated with the above analog output stage register address space. The analog output registers may include an output configuration register, an output status register, an output direct write register, phase shift register, output interrupt sources register, FIFO mode and format register, and other registers as herein disclosed. The following tables represent these registers.

Output control register:

| Bit | Name | Description | Reset state |
|---|---|---|---|
| 14-12 | AOUT_CFG_WCLKx | Clock source for the waveform generator<br>000—software<br>001—33 MHz<br>010—24 MHz<br>011—CLOUT CVCLK<br>100—auto (33 MHz-based)<br>101—Auto (32-MHz based, reserved) | 0 |
| 11 | AOUT_CFG_BUFE | =1—enable output buffer, when disabled output buffer does not drive the output line | 0 |
| 10-8 | AOUT_CFG_FCLKx | Clock source for the FIFO<br>000—software<br>001—33 MHz<br>010—24 MHz<br>011—CLOUT CLCLK<br>100-111—reserved | 0 |
| 7-6 | AOUT_CFG_FMx | FIFO Mode (where to redirect FIFO data)<br>00—AOut direct (DW0-3, DW)<br>01—Command (PHA/PHB, GAINA/GAINB)<br>10 and 11—reserved | 0 |
| 5 | AOUT_CFG_RSV5 | Reserved | 0 |
| 4 | AOUT_CFG_RSV4 | Reserved | 0 |

Output control register:

| Bit | Name | Description | Reset state |
|---|---|---|---|
| 3 | AOUT_CFG_WE3 | =1—enable Waveform writes to AOut3 (=—AOut2 relatively to midscale) | 0 |
| 2 | AOUT_CFG_WE2 | =1—enable Waveform writes to AOut2 | 0 |
| 1 | AOUT_CFG_WE1 | =1—enable Waveform writes to AOut1 (=—AOut0 relatively to midscale) | 0 |
| 0 | AOUT_CFG_WE0 | =1—enable Waveform writes to AOut0 | 0 |

Output Status Register:

| Bit | Name | Description | Reset state |
|---|---|---|---|
| 4 | AOUT_STS_C | =1—write to the AOut via DW is completed | 0 |
| 3 | AOUT_STS_C3 | =1—write to the AOut3 via DW3 is completed | 0 |
| 2 | AOUT_STS_C2 | =1—write to the AOut2 via DW2 is completed | 0 |
| 1 | AOUT_STS_C1 | =1—write to the AOut1 via DW1 is completed | 0 |
| 0 | AOUT_STS_C0 | =1—write to the AOut0 via DW0 is completed | 0 |

Output Direct write register:

| Bit | Name | Description | Reset state |
|---|---|---|---|
| 31 | AOUT_DW_UPD | 1—update all DACs | 0 |
| 30-16 | RSV30_16 | Reserved | 0 |
| 15-0 | AOUT_DW_Dx | Data bits loaded into 16-bit DAC | 0 |

The output phase shift register may be used in waveform mode (e.g. when one or more WEx bits are set in the output configuration register) and allows precise control of the phase shift between outputs and relative to analog input. Phase may be defined by two parameters—sample offset within output waveform and delay in microseconds before outputting first and all consecutive samples after the waveform clock arrives. In an embodiment this delay should be shorter than the time interval between waveform clocks. In an embodiment with 1024 samples in the output waveform 10 bits are required to set sample-based phase shift. An additional 18 bits are used to set phase delay in microseconds thus allowing very slow waveforms (e.g. maximum delay is ~0.25 sec).

Output phase shift register:

| Bit | Name | Description | Reset state |
|---|---|---|---|
| 31-28 | RSV31_28 | Reserved | 0 |
| 27-18 | AOUT_PH_Ix | Phase shift delay as index in the output waveform | 0 |
| 17-0 | AOUT_PH_USx | Phase shift delay in uS relatively to the Waveform clock | 0 |

Output-based interrupts may be controlled by three registers that provide enable, status, and clear interrupt functionality. The table below shows an exemplary embodiment that could be applied to each of the output control registers:

Output Control Register:

| Bit | Name | Description | Reset state |
|---|---|---|---|
| 2 | AOUT_FE | FIFO empty | 0 |
| 1 | AOUT_FHF | FIFO half full | 0 |
| 0 | AOUT_FF | FIFO full | 0 |

Output FIFO mode and format register:

| Bit | Name | Description | Reset state |
|---|---|---|---|
| | | FIFO format in AOut DAC Direct mode | |
| 21-19 | AOUT_FDR_Cx | DAC command - see AD5664 manual, brief list:<br>010—write channel, update all<br>011—write and update channel<br>100—power-down DAC<br>101—reset<br>110—load LDAC | |
| 18-16 | AOUT_FDR_Ax | 000—AOut0<br>001—AOut1<br>010—AOut2<br>011—AOut3<br>111—All AOuts | |
| 15-0 DAC data bits 15:0 | AOUT_FDR_Dx | DAC data bits 15:0 | |

| Output FIFO mode and format register: | | | |
|---|---|---|---|
| Bit | Name | Description | Reset state |
| FIFO format in command mode | | | |
| 31 | AOUT_FDR_CMD_WZ | Wait for "zero" command, if set will delay advance from the FIFO until corresponding waveform counter ("A" or "B", detected automatically based on the following command bits) will pass through the sample with index zero. This is done to change offset/gain/phase at the zero crossing thus reducing possible spikes. This command is combinable with any other command | |
| 30-28 | AOUT_FDR_CMDx | FIFO command bits<br>0—Data bits will be targeted to PHA (phase "A") register<br>1—Data bits will be targeted to PHB (phase "B") register<br>2—Data bits will be targeted to GAINA (AOut 0-1 gain) register<br>3—Data bits will be targeted to GAINB (AOut 2-3 gain) register<br>All other commands are reserved | |
| 27-0 | AOUT_FDR_DTx | FIFO data bits<br>All 28 bits are copied to PHA/PHB register for the PHx command and 16 LSBs are targeted to GAINA/B registers for the GAINx command | |

Each analog input channel in the analog input address space 718 may include a plurality of registers to enable various features, functions, and operation of an input stage for a synchro/resolver configuration such as that depicted by FIG. 4. The following table of registers is exemplary of such a plurality of registers.

| Table of synchro/resolver analog input registers. | | | | |
|---|---|---|---|---|
| Register address | Read access | Write Access | Note | Reset state |
| +0x00 | AIN_CFG0 | AIN_CFG0 | AIn Configuration, used to select clock source, FIFO mode, averaging, gain, zero crossing source (AIn/AOut) and some other AIn settings | 0x0 |
| +0x04 | AIN_CFG1 | AIN_CFG1 | | 0x0 |
| +0x08 | AIN_STS | | Status, currently replicate current "sticky" state of the interrupt request sources and some extra status bits | 0x0 |
| +0x0C | AIN_ZL | AIN_ZL | Zero level, 16LSBs, set level of the expected mid-scale voltage for the signal that is applied at the channel that is used for the zero-level detection. When read reports currently used zero level | 0x0 |
| +0x10 | AINA_LV | | Last value delivered by the corresponding A/D after the calibration coefficients are applied, straight binary | 0x0 |
| +0x14 | AINB_LV | | | 0x0 |
| +0x18 | AINC_LV | | | 0x0 |
| +0x1C | AIND_LV | | | 0x0 |
| +0x20 | | AINA_OFFS | Offset applied to the AIn 16LSBs (twos-compliment) | 0x0 |
| +0x24 | | AINB_OFFS | | 0x0 |
| +0x28 | | AINC_OFFS | | 0x0 |
| +0x2C | | AIND_OFFS | | 0x0 |
| +0x30 | | AINA_GAIN | Gain applied to the AIn A (0x0 = 0, 0x7FFF/0x8000 = 1, 0xFFFF = 2) | 0x0 |
| +0x34 | | AINB_GAIN | | 0x0 |
| +0x38 | | AINC_GAIN | | 0x0 |
| +0x3C | | AIND_GAIN | | 0x0 |

-continued

Table of synchro/resolver analog input registers.

| Register address | Read access | Write Access | Note | Reset state |
|---|---|---|---|---|
| +0x40 | AINA_MIN | | Maximum/Minimum value at the corresponding analog input during the last detected period of the waveform. Valid only if periodic signal is applied to the detector input | 0x0 |
| +0x44 | AINB_MIN | | | 0x0 |
| +0x48 | AINC_MIN | | | 0x0 |
| +0x4C | AIND_MIN | | | 0x0 |
| +0x50 | AINA_MAX | | | 0x0 |
| +0x54 | AINB_MAX | | | 0x0 |
| +0x58 | AINC_MAX | | | 0x0 |
| +0x5C | AIND_MAX | | | 0x0 |
| +0x60 | | AIN_PH | Phase delay of the corresponding waveform relatively to the global "zero-cross" detection, defined in 66 MHz clocks. Used to delay capture of the sum on the input. | 0x0 |
| +0x64 | AIN_PHDET | | Detected phase delay defined in 66 MHz clocks. Defined as number of clocks between waveform on the channel selected as excitation input and waveform on the channel with highest amplitude at the current moment. | 0x0 |
| +0x70 | AIN_SA | | 24-bit sum of corresponding waveform accumulated during the last ½ period. Internal register that is used to accumulate sum reset to zero every time when sum is ready and then accumulates signed sum of all samples until the next zero crossing (delayed by phase register) | 0x0 |
| +0x74 | AIN_SB | | | 0x0 |
| +0x78 | AIN_SC | | | 0x0 |
| +0x7C | AIN_SD | | | 0x0 |
| +0x80 | AIN_RAW | | Tangent of the current angle in following format: Bits 14:0 represent tangent of 0-45° scaled into integer (0x0 = 0, 0x4000 = 1.0) and bits 31:28 define "base" angle where position lies:<br>0000 = 0-45°<br>0001 = 45-90°<br>0010 = 90-135°<br>0011 = 135-180°<br>0100 = 180-225°<br>0101 = 225-270°<br>0110 = 270-315°<br>0111 = 315-360°<br>1xxx = indicates lost tracking (lost tracking is defined as acceleration that exceeds limit in ACCL register) | 0x0 |
| +0x84 | AIN_ANG | | Current angle 0-360° as 17-bit integer:<br>0x0 = 0° 0x19228 = 360° | 0x0 |
| +0x88 | AIN_ACC | AIN_ACCL | Read - report change between last two angular readings - indicates acceleration. Write - set maximum acceleration limit, acceleration above this limit indicates lost of tracking. | 0x0 |
| +0x8C | AIN_ZC0 | | Interval between zero crossings - positive ½, based on current (24 MHz/33 MHz/CLI) base frequency | 0x0 |
| +0x90 | AIN_ZC1 | | Interval between zero crossings - negative ½, based on current | 0x0 |

Table of synchro/resolver analog input registers.

| Register address | Read access | Write Access | Note | Reset state |
|---|---|---|---|---|
| +0xB0 | | AIN_IER | (24 MHz/33 MHz/CLI) base frequency Interrupt enable register, selects interrupt sources that should be enabled | 0x0 |
| +0xB4 | AIN_ISR | | Interrupt status register, reports currently pending IRQ sources | 0x0 |
| +0xB8 | | AIN_ICR | Interrupt clear register, used to clear pending IRQs | 0x0 |
| +0xBC | AIN_CLK | AIN_DIV | Divider for the 24/33 MHz clock - AIn rate, on read - Software clock for the AIn | 0x0 |
| +0xC0 | AIN_FDR | | FIFO data register, 32-bit, format varies depending on the selected configuration | 0x0 |
| +0xC4 | | AIN_FCR | FIFO count register, reports number of occupied samples in 1024-sample AIn FIFO | 0x0 |
| +0xC8 | | AIN_FWM | FIFO Watermark level, used to generate IRQ | 0x0 |

The analog input registers may include two input configuration registers, an input status register, an input interrupt source register, and others described herein. The following tables represent an embodiment of each of the input configuration, input status, and input interrupt registers.

Input configuration register 0:

| Bit | Name | Description | Reset state |
|---|---|---|---|
| 31 | AIN_CFG_SYN | =1—use Synchro mode, connect 240° phase to the channel selected in COSx bits | 0 |
| 30-4 | RSV30_4 | Reserved | 0 |
| 7-4 | AIN_CFG_END AIN_CFG_ENC AIN_CFG_ENB AIN_CFG_ENA | =1 in corresponding bits - use data from the "A"-"D" data inputs Note: that "D" input should be enabled if AIN_CFG_ZMx = 1 or 3 and at least two out of three "A"-"C" inputs should be enabled for the synchro/resolver operation, however disconnected channels should be disabled and not used in auto-zeroing process | 0 |
| 3-2 | AIN_CFG_COSx | Select source of the Cosine signal 0—use AIn A 1—use AIn B 2—use AIn C 3—use AIn D | 0 |
| 0-1 | AIN_CFG_SINx | Select source of the Sine signal 0—use AIn A 1—use AIn B 2—use AIn C 3—use AIn D | 0 |

Input Configuration Register 1:

| Bit | Name | Description | Reset state |
|---|---|---|---|
| 31-30 | AIN_CFG_CLKx | Clock for the AIn ADC 0—Software clock 1—33 MHz 2—24 MHz 3—CLI CVCLK | 0 |
| 26-29 | RSV29_26 | Reserved | 0 |
| 25 | AIN_CFG_PTM | =1 pass-through mode, zero detector is disabled and data from A/B/C/D are dumped into the FIFO in two consecutive writes, on the first write 16MSBs occupied by the "A" data and 16LSBs by "B" data, on the second write 16 MSBs occupied by the "C" data and 16LSBs by "D" data | 0 |
| 24 | AIN_CFG_FST | =1 store timestamp into FIFO | 0 |
| 23 | AIN_CFG_FSD | =1 store Sa/Sb/Sc/Sd to the output FIFO (works if PTM = 0). Note that Sx is stored to the FIFO only when zero crossing is detected and not at the time when sum is computed. | 0 |
| 22 | AIN_CFG_FSC | | 0 |
| 21 | AIN_CFG_FSB | | 0 |
| 20 | AIN_CFG_FSA | | 0 |
| 19 | AIN_CFG_FSR | =1 store acceleration to the FIFO (PTM should set to 0) | 0 |
| 18 | AIN_CFG_FSP | =1 store position to the FIFO (PTM should set to 0) | 0 |
| 17 | AIN_CFG_ZLH | =1 enable low-->high (ZLH) or high-->low | 0 |

-continued

| | | Input Configuration Register 1: | |
|---|---|---|---|
| 16 | AIN_CFG_ZHL | (ZHL) zero crossing detection. Actual zero crossings are detected on the selected by the ZCx bits source waveform regardless of the state of ZLH and ZHL bits but position calculations are performed only on the selected edge or edges. | 0 |
| 15-14 | AIN_CFG_GDx | Gain code for the corresponding channel | 0 |
| 13-12 | AIN_CFG_GCx | 0 = x1, other 3 gains are PGA-dependent, currently | 0 |
| 11-10 | AIN_CFG_GBx | | 0 |
| 9-8 | AIN_CFG_GAx | 1 = x2<br>2 = x5<br>3 = x10 | 0 |
| 7-4 | AIN_CFG_ZMx | Zero crossing mode:<br>0—use auto-selected AIn A/B/C (only enabled inputs are used)<br>1—use AIn D ("D" should be enabled)<br>2—use auto-selected AIn A/B/C (only enabled inputs are used) with auto-detection of the level of zero<br>3—use AIn D ("D" should be enabled) with auto-detection of the level of zero<br>4—use AOut<br>5—use DIn 0 (should be applied at 2x excitation frequency)<br>6—use CLI_CLCLK (should be applied at 2x excitation frequency)<br>7-15—reserved | 0 |
| 3-0 | AIN_CFG_ZCx | 4-bit zero crossing code, # of samples that is averaged in order to detect zero crossing:<br>0 = 1, 1 = 2, 2 = 4, 3 = 8, 4 = 16, 5 = 32, 6 = 64, 7 = 128, 8 = 256 | 0 |

| | | Input status register: | |
|---|---|---|---|
| Bit | Name | Description | Reset state |
| 8 | AIN_STS_DR | "A"-"D" data is ready | 0 |
| 7-0 | AIN_STS_IRQ | Mirrors corresponding IRQ bits | 0 |

| | | Input Interrupt Source Register: | |
|---|---|---|---|
| Bit | Name | Description | Reset state |
| 7 | AIN_TR | Tangent calculations complete | |
| 6 | AIN_FE | FIFO empty | |
| 5 | AIN_FHF | FIFO half full | |
| 4 | AIN_FF | FIFO full | |
| 3 | AIN_ZLH | Rising edge zero crossing was detected | |
| 2 | AIN_ZHL | Falling edge zero crossing was detected | |
| 1 | AIN_AR | Angle calculation completed - angle data is valid | |
| 0 | AIN_ACC | Acceleration above the limit - lost tracking | |

The platform may include a layer control and configuration register which may be used to set common settings such as the on/off state of a status LED. An Isolated Side TX Register (ISTR) may be used to access digital output bits, reset individual blocks on the platform and switch zero crossing debug mode On/Off. An Isolated Side RX Register (ISDR) may be used to provide the current state of digital inputs. An interrupt register may be used to enable and monitor interrupts generated by the platform. The following table shows exemplary embodiments of the function and description of each of these registers.

| | | Layer Control Register: | |
|---|---|---|---|
| Bit | Name | Description | Reset state |
| 1 | LCR_LED | Enable (turn-on)/Disable (turn-off) status LED. 1 in this bit turn on status LED. | 0 |
| 0 | DCDIS | =1—disable all DC/DCs that are powering the attachments | 0 |

| | | ISTR Control Register: | |
|---|---|---|---|
| Bit | Name | Description | Reset state |
| 21-20 | AO_CH | Select analog output channel number for the waveform download (waveform memory page selector)<br>0 - Channel 0 (AOuts 0/1/2/3)<br>1 - Channel 1 (AOuts 4/5/6/7)<br>2-3 - reserved | 0 |
| 16 | DBG_ZC | 1 = Debug Zero crossings - DO[2: 0] will indicate AIn zero crossing detection and DO[6: 4] AOut zero crossings<br>DO[0] = zero crossing L->H AIn 0<br>DO[1] = zero crossing L->H AIn 1<br>DO[2] = zero crossing H->L AOut 0<br>DO[4] = zero crossing L->H AOut 0<br>DO[5] = zero crossing H->L AOut 1<br>DO[6] = zero crossing L->H AOut 1 | 0 |
| 15-12 | RST_AOx | 1 = Reset analog output block on corresponding channel<br>Bit 12 - reset AO channel 0<br>Bit 13 - reset AO channel 1<br>Bits 14-15 - reserved | 0 |
| 11-8 | RST_AIx | 1 = Reset analog input block on corresponding channel<br>Bit 8 - reset AI channel 0 | 0 |

ISTR Control Register:

| Bit | Name | Description | Reset state |
|---|---|---|---|
| 7-0 | DOUTx | Bit 9 - reset AI channel 1<br>Bits 11-10 - reserved<br>Digital Output bits 7-0<br>Bit 7 - Reserved<br>Bit 6 - CH1.DOut 2<br>Bit 5 - CH1.DOut 1<br>Bit 4 - CH1.DOut 0<br>Bit 3 - Reserved<br>Bit 2 - CH0.DOut 2<br>Bit 1 - CH0.DOut 1<br>Bit 0 - CH0.DOut 0 | 0 |

ISDR Control Register:

| Bit | Name | Description | Reset state |
|---|---|---|---|
| 7-0 | DINx | Digital Input bits 7-0<br>Bit 7 - Reserved<br>Bit 6 - Reserved<br>Bit 5 - Reserved<br>Bit 4 - CH1.DIn 0<br>Bit 3 - Reserved<br>Bit 2 - Reserved<br>Bit 1 - Reserved<br>Bit 0 - CH0.DIn 0 | 0 |

Interrupt Control Register:

| Bit | Name | Description | Reset state |
|---|---|---|---|
| 31-16 | RSV | Standard IRQ Sources (See IER/IMR/ISR/ICR description) | 0 |
| 15-12 | RSV15_12 | Reserved | 0 |
| 11 | IR_IP1 | Input overcurrent on the positive rail on the channel 1 | 0 |
| 10 | IR_IN1 | Input overcurrent on the negative rail on the channel 1 | 0 |
| 9 | IR_IP0 | Input overcurrent on the positive rail on the channel 0 | 0 |
| 8 | IR_IN0 | Input overcurrent on the negative rail on the channel 0 | 0 |
| 7-6 | RSV7_6 | Reserved | 0 |
| 5 | IR_AO1 | Interrupt from AOut @ channel 1 | 0 |
| 4 | IR_AO0 | Interrupt from AOut @ channel 0 | 0 |
| 3-2 | RSV3_2 | Reserved | 0 |
| 1 | IR_AI1 | Interrupt from AIn @ channel 1 | 0 |
| 0 | IR_AI0 | Interrupt from AIn @ channel 0 | 0 |

Each analog out channel in the analog out address space 710 may include a plurality of registers to enable various features, functions, and operation of an output stage for a synchro/resolver configuration such as that depicted by FIG. 6. The following table of registers is exemplary of such a plurality of registers.

Table of synchro/resolver analog output registers.

| Register address | Read access | Write Access | Note | Reset state |
|---|---|---|---|---|
| 16'h00, | AOUT_CFG | AOUT_CFG | Configuration, used to select clock source for the FIFO and Waveform Generator, enable output buffers, control FIFO mode and Waveform output channels | 0x0 |
| 16'h04, | AOUT_STS | | Status - reports when channel was updated (in Direct Write mode) | 0x0 |
| 16'h10, | | AOUT_DW0 | Write to the AOut0-3, 16LSBs | 0x0 |
| 16'h14, | | AOUT_DW1 | represent analog output data + bit 31 | 0x0 |
| 16'h18, | | AOUT_DW2 | is "Update all" bit | 0x0 |
| 16'h1C, | | AOUT_DW3 | | |
| 16'h20, | | AOUT_OFFS0 | Calibration Offset applied to the AOut | 0x0 |
| 16'h24, | | AOUT_OFFS1 | 0-3, 16LSBs (twos-compliment) | 0x0 |
| 16'h28, | | AOUT_OFFS2 | | 0x0 |
| 16'h2C, | | AOUT_OFFS3 | | 0x0 |
| 16'h30, | | AOUT_GAIN0 | Gain applied to the AIn A (0x0 = 0, | 0x0 |
| 16'h34, | | AOUT_GAIN1 | 0x8000 = 1) | 0x0 |
| 16'h38, | | AOUT_GAIN2 | | 0x0 |
| 16'h3C, | | AOUT_GAIN3 | | 0x0 |
| 16'h40, | | AOUT_PHA | Phase of the AOutA/B/C/D. Bits 9: 0 defines offset within output waveform in samples and 27: 10 defines delay before first sample is outputted (in uS, 0.262 sec max) bits 31: 28 are reserved (should be 0s) | 0x0 |
| 16'h44, | | AOUT_PHB | | 0x0 |
| 16'h48, | | AOUT_PHC | | 0x0 |
| 16'h4C, | | AOUT_PHD | | 0x0 |
| 16'h50, | | AOUT_GAINA | Gain may be applied to DACs pairs simultaneously by adjusting values in GAINx registers, DAC engine automatically prevent output from the phase reversal as a result of gain. Gain applied to AOuts (0x0 = 0, 0x8000 = 1) | 0x0 |

Table of synchro/resolver analog output registers.

| Register address | Read access | Write Access | Note | Reset state |
|---|---|---|---|---|
| 16'h54, | | AOUT_GAINB | | 0x0 |
| 16'h58, | | AOUT_GAINC | | 0x0 |
| 16'h5C, | | AOUT_GAIND | | 0x0 |
| 16'h60, | AOUT_WCLK | AOUT_WDIV | Divider for the 24/33 MHz clock - Waveform rate. Read - Software clock for the Waveform | 0x0 |
| 16'h64, | | AOUT_WCNT | # index of the last sample (starting from 0) loaded to the waveform (wraparound limit for the waveform generation - used to set number of actual samples in the waveform) | 0x0 |
| 16'h68, | | AOUT_NDIV | # of bits that is needed shift divider for the digital PLL (used when "auto" clock source is selected and WCNT should be loaded with value that is power of 2 only) 1 = 2, 2 = 4, 4 = 8, etc | 0x0 |
| 16'h6C, | | AOUT_DW | Direct write to the DAC, 22 LSBs are directly translated to the AD5664, offset = 0 and Gain = 0x8000 | 0x0 |
| 16'h70, | | AOUT_IER | Interrupt enable register | 0x0 |
| 16'h74, | AOUT_ISR | | Interrupt status register | 0x0 |
| 16'h78, | | AOUT_ICR | Interrupt clear register | |
| 16'h80, | AOUT_FCLK | AOUT_FDIV | Divider for the FIFO 24/32 MHz clock Software clock for the FIFO | |
| 16'h84, | | AOUT_FDR | FIFO data register, 32-bit, format varies | |
| 16'h88, | AOUT_FCR | | FIFO count register | |
| 16'h8C, | | AOUT_FWM | FIFO Watermark level | |

The platform 100 may include analog output registers associated with the above analog output stage register address space. The analog output registers may include an output configuration register, an output status register, an output direct write register, phase shift register, output interrupt sources register, FIFO mode and format register, and other registers as herein disclosed. The following tables represent these registers.

The output configuration register is used to configure each analog output channel. Note that in this table, analog output channels are named AOut0/1/2/3 and also A/B/C/D. When AOut0/1/2/3 is used, it refers to a physical DAC or output circuit, whereas when A/B/C/D are used, they refer to the waveform signal that is output. This naming differentiation facilitates simplifying calibration because all calibration coefficients are loaded to OFFSx and GAINx registers where x is 0/1/2/3 while waveform span and phase is controlled via PHy and GAINy registers where y is A/B/C/D. In this way a logical operation associated with configuring a waveform, such as setting a phase offset is readily distinguished from a physical operation such as changing the gain voltage on an output DAC.

| Bit | Name | Description | Reset state |
|---|---|---|---|
| 19 | AOUT_CFG_AO3E | =1 - enable corresponding output buffer, when disabled, output buffer does not drive the output line | 0 |
| 18 | AOUT_CFG_AO2E | | 0 |
| 17 | AOUT_CFG_AO1E | | 0 |
| 16 | AOUT_CFG_AO0E | | 0 |
| 15 | RSV15 | Reserved | 0 |
| 14-12 | AOUT_CFG_WCLKx | Clock source for the waveform generator<br>000-software<br>001-33 MHz<br>010-24 MHz<br>011-CLOUT CVCLK<br>100-auto (33 MHz-based)<br>101 - Auto (24-MHz based)<br>110 and 111 - reserved | 0 |
| 11-10 | RSV11_10 | Reserved | 0 |
| 10-8 | AOUT_CFG_FCLKx | Clock source for the FIFO<br>00-software<br>01-33 MHz<br>10-24 MHz<br>11-CLOUT CLCLK | 0 |
| 7-6 | RSV7_6 | Reserved | 0 |
| 5-4 | AOUT_CFG_FMx | FIFO Mode (where to redirect FIFO data)<br>00 - AOut direct (DW0-3, DW)<br>01 - Command (PHx, GAINx)<br>10 and 11 - reserved | 0 |
| 3 | AOUT_CFG_WE3 | =1 - enable Waveform writes to AOut3 | 0 |
| 2 | AOUT_CFG_WE2 | =1 - enable Waveform writes to AOut2 | 0 |
| 1 | AOUT_CFG_WE1 | =1 - enable Waveform writes to AOut1 | 0 |
| 0 | AOUT_CFG_WE0 | =1 - enable Waveform writes to AOut0 | 0 |

Output Status Register:

| Bit | Name | Description | Reset state |
|---|---|---|---|
| 5 | AOUT_STS_DIS | =1 - all output buffers are disabled due to the overcurrent condition. Outputs may be re-enabled by writing 1 to the corresponding bits in the AOut CFG | 0 |

Output Status Register:

| Bit | Name | Description | Reset state |
|---|---|---|---|
| 4 | AOUT_STS_C | =1 - write to the AOut via DW is completed | 0 |
| 3 | AOUT_STS_C3 | =1 - write to the AOut3 via DW3 is completed | 0 |
| 2 | AOUT_STS_C2 | =1 - write to the AOut2 via DW2 is completed | 0 |
| 1 | AOUT_STS_C1 | =1 - write to the AOut1 via DW1 is completed | 0 |
| 0 | AOUT_STS_C0 | =1 - write to the AOut0 via DW0 is completed | 0 |

Output Direct write register:

| Bit | Name | Description | Reset state |
|---|---|---|---|
| 31 | AOUT_DW_UPD | 1 - update all DACs | 0 |
| 30-16 | RSV30_16 | Reserved | 0 |
| 15-0 | AOUT_DW_Dx | Data bits loaded into 16-bit DAC | 0 |

The output phase shift register may be used in waveform mode (e.g. when one or more WEx bits are set in the output configuration register) and allows precise control of the phase shift between outputs and relative to analog input. Phase may be defined by two parameters—sample offset within output waveform and delay in microseconds before outputting first and all consecutive samples after the waveform clock arrives. In an embodiment this delay should be shorter than the time interval between waveform clocks. In an embodiment with 1024 samples in the output waveform 10 bits are required to set sample-based phase shift. An additional 18 bits are used to set phase delay in microseconds thus allowing very slow waveforms (e.g. maximum delay is ~0.25 sec).

Output phase shift register:

| Bit | Name | Description | Reset state |
|---|---|---|---|
| 31-28 | RSV31_28 | Reserved | 0 |
| 27-18 | AOUT_PH_Ix | Phase shift delay as index in the output waveform | 0 |
| 17-0 | AOUT_PH_USx | Phase shift delay in uS relatively to the Waveform clock | 0 |

Output-based interrupts may be controlled by three registers that provide enable, status, and clear interrupt functionality. The table below shows an exemplary embodiment that could be applied to each of the output control registers:

Output Control Register:

| Bit | Name | Description | Reset state |
|---|---|---|---|
| 3 | AOUT_OC | Overcurrent detected - outputs are disabled | 0 |
| 2 | AOUT_FE | FIFO empty | 0 |
| 1 | AOUT_FHF | FIFO half full | 0 |
| 0 | AOUT_FF | FIFO full | 0 |

Output FIFO mode and format register:

| Bit | Name | Description | Reset state |
|---|---|---|---|
| FIFO format in AOut DAC Direct mode | | | |
| 21-19 | AOUT_FDR_Cx | DAC command - see AD5664 manual, brief list:<br>010 - write channel, update all<br>011 - write and update channel<br>100 - power-down DAC<br>101 - reset<br>110 - load LDAC | |
| 18-16 | AOUT_FDR_Ax | 000 - AOut0<br>001 - AOut1<br>010 - AOut2<br>011 - AOut3<br>111 - All AOuts | |
| 15-0 DAC data bits 15:0 | AOUT_FDR_Dx | DAC data bits 15: 0 | |
| FIFO format in command mode | | | |
| 31 | AOUT_FDR_CMD_WZ | Wait for "zero" command, if set will delay advance from the FIFO until corresponding waveform counter ("A" or "B", detected automatically based on the following command bits) will pass through the sample with index zero. This is done to change offset/gain/phase at the zero crossing thus reducing possible | |

-continued

Output FIFO mode and format register:

| Bit | Name | Description | Reset state |
|---|---|---|---|
| 30-28 | AOUT_FDR_CMDx | spikes. This command is combinable with any other command<br>FIFO command bits<br>0 - Data bits will be targeted to PHA<br>1 - Data bits will be targeted to PHB<br>2 - Data bits will be targeted to PHC<br>3 - Data bits will be targeted to PHD<br>4 - Data bits will be targeted to GAINA<br>5 - Data bits will be targeted to GAINB<br>6 - Data bits will be targeted to GAINC<br>7 - Data bits will be targeted to GAIND | |
| 27-0 | AOUT_FDR_DTx | FIFO data bits<br>All 28 bits are copied to PHA/PHB/PHC/PHD register for the PHx command and 16 LSBs are targeted to GAINA/B/C/D registers for the GAINx command | |

The methods and systems associated with the platform 100 may be employed in various environments and applications including at least LVDT/RVDT input position detection, LVDT/RVDT simulator, synchro input position detection, resolver input position detection, synchro simulator, and resolver simulator. Additionally, the configuration/operation of the platform 100 may be characterized by LVDT/RVDT operation modes including: input with external excitation in 4, 5, or 6 wire configuration; input with external excitation in 4, 5, or 6 wire configuration; LVDT/RVDT sensor simulation mode in 4, 5, or 6 wire configuration. These use environments, applications, and operating modes are exemplary and are not meant to be limiting.

Figure 8:
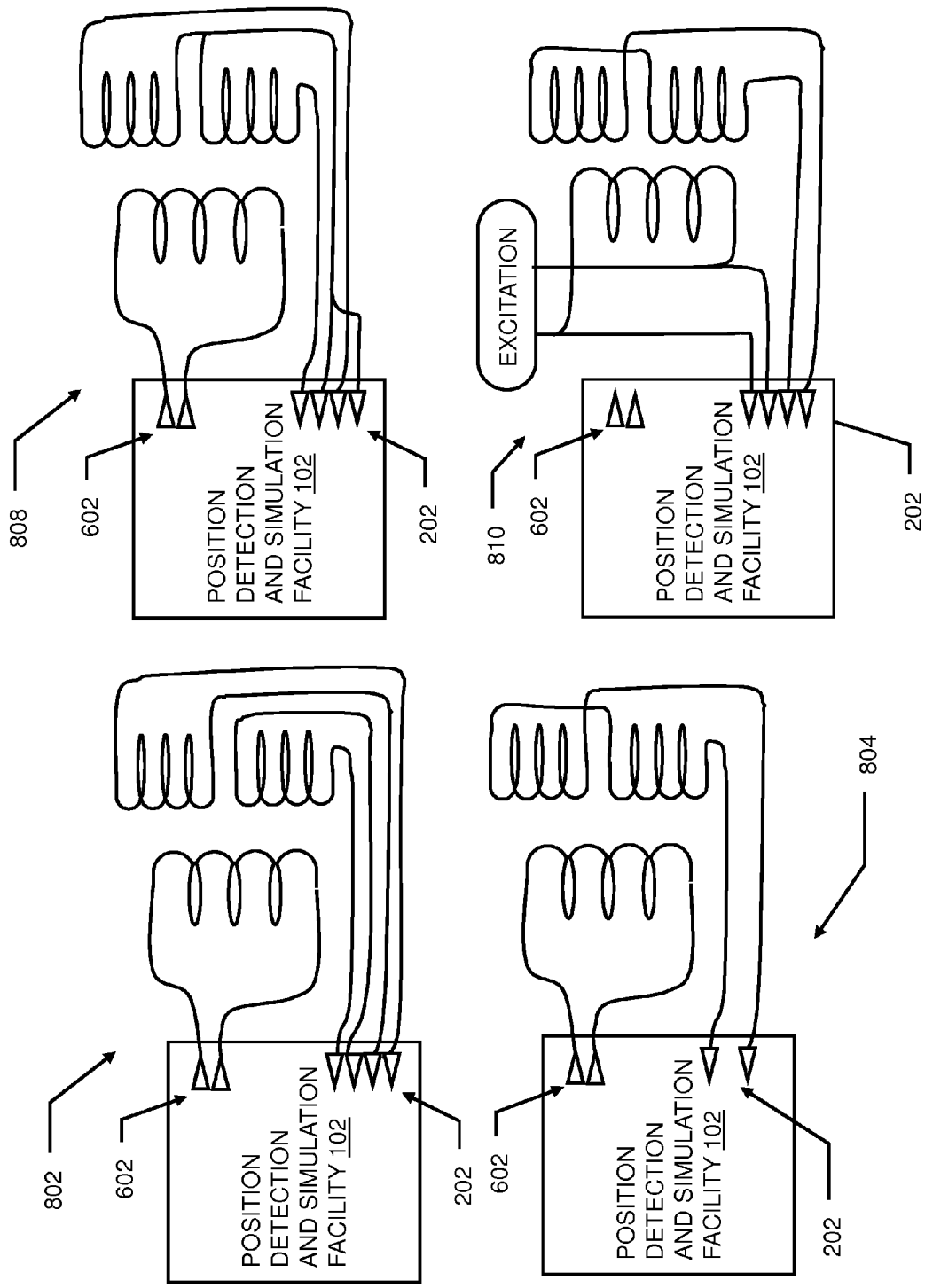
FIG. 8 depicts example LVDT/RVDT applications.

FIG. 8 depicts connections to an LVDT/RVDT device in a 4-wire, 5-wire, and a 6-wire application with internal excitation and a 6-wire application with external excitation. In the 6-wire configuration 802, the LVDT/RVDT primary coil is driven by two outputs 602 of the platform 100. Alternatively, one output 602 could be connected to an end of the primary coil and the other end of the primary coil could be connected to common. Also in the 6-wire configuration 802, the LVDT/RVDT stator coil connections are each individually and separately connected to inputs 202 of the platform 100, resulting in four inputs 202 being used. In this embodiment, the primary coil is energized by an output waveform generated by the one or two outputs 602 and the resulting voltage signal generated out of the stator coils is detected by the four inputs 202. In the 4-wire configuration 804, the primary wiring may be the same as the 6-wire scenario, however two of the LVDT/RVDT stator coil connections are connected together and the other two, one from each stator coil, are connected to individual inputs 202. In the 5-wire configuration 808, the primary wiring may be the same as the 6-wire with the exception that the stators have a common node that is commonly connected to both input channels. In the 6-wire configuration with external excitation 810, an external excitation source provides a waveform to both the platform 100 and to a device (e.g. LVDT/RVDT) that is connected to the platform 100 for stator data output and analysis. These configurations may be represented in the following table Input LVDT/RVDT connection table:

| | | 4-wires | | 5/6-wires | |
|---|---|---|---|---|---|
| LVDT/RVDT | | Output 602 | Input 202 | Output 602 | Input 202 |
| Input, internal excitation | | Connect output signals P1+ and P1− to the primary. | Connect input signals S1+ and S1− to Vout produced by the stator coil configuration | Connect output signals P1+ and P1− to the primary | Connect input signals S1+ and S1− to stator output Va; and input signals S2+ and S2− to stator output Vb |
| Input, external excitation | | No output connections required | Connect input signals S1+ and S1− to Vout produced by the stator coil configuration; Connect input signals S2+ and S2− to external excitation source. | No output connections required | Connect input signals S1+ and S1− to stator output Va; and input signals S2+ and S2− to stator output Vb |

Figure 9:
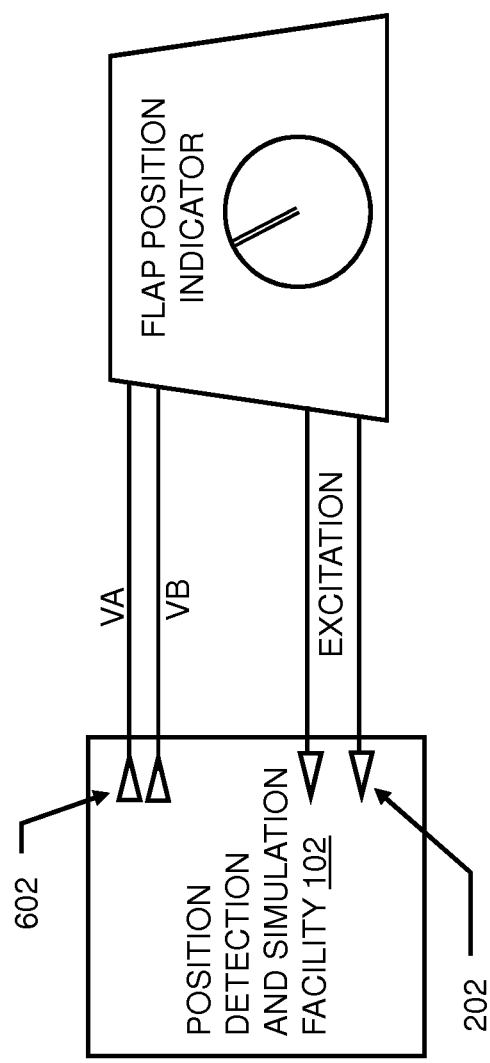
FIG. 9 depicts an example LVDT/RVDT simulation.

Referring to FIG. 9, an LVDT/RVDT flap position indicator simulator configuration may allow an embodiment of the platform to provide LVDT/RVDT stator signals instead of using a physical LVDT/RVDT device. In a 4-wire LVDT/RVDT simulation 902, two outputs 602 are configured and operated cooperatively to provide a differential signal that is typically provided by the LVDT/RVDT device stators. As shown in FIG. 9, external excitation is used in the simulation, therefore two inputs 202 are connected to the externally supplied excitation signal +/−. The two inputs 202 may be processed by the input logic to determine some of the operating parameters, such as clocking parameters to generate a simulated Vout equivalent signal. In a 6-wire simulation (not shown), two outputs 602 provide an equivalent Va signal and two other outputs provide an equivalent Vb signal. Logic and configuration registers in the platform 100 are programmed to ensure that the simulation is appropriate and closely represents how a physical LVDT/RVDT would perform given the equivalent input conditions, such as the excitation signals. The following table depicts the simulation configuration connections.

| LVDT/RVDT Simulation connection table | | | | |
|---|---|---|---|---|
| | 4-wires | | 5/6-wires | |
| LVDT/RVDT | Output 602 | Input 202 | Output 602 | Input 202 |
| Simulator, external excitation | Outputs P1+ and P1− provide Vout | Excitation signals + and − are connected to inputs S1+ and S1− | Outputs P1+ and P1− provide Va; P2+ and P2− provide Vb | Excitation signals + and − are connected to inputs S1+ and S1− |

Alternatively the platform may be operated for synchro/resolver applications in at least the following modes: synchro input with internal excitation; resolver input with internal excitation; synchro input with external excitation; resolver input with external excitation; synchro simulation with internal excitation for fully sourced operation; resolver simulation with internal excitation for fully sourced operation; synchro simulation with externally sourced excitation; and resolver simulation with externally sourced excitation. Synchro and resolver applications are represented by standard designations such as Sx for Stator connections, Rx for rotor excitation connections, C for common connection, and the like. Synchros typically have one common connection C and three stator connections S1, S2, S3 that provide a voltage relative to common that reflects a position of the rotor. Resolver applications typically include four stator connections associated with two stators S1, S3 and S2, S4. Rotors typically have one or two windings. A one winding rotor may include connections R1 and R2, where as a two winding rotor may have R1, R2, R3, and a common C or may have separately excited windings R1, R3 and R2, R4.

Figure 10:
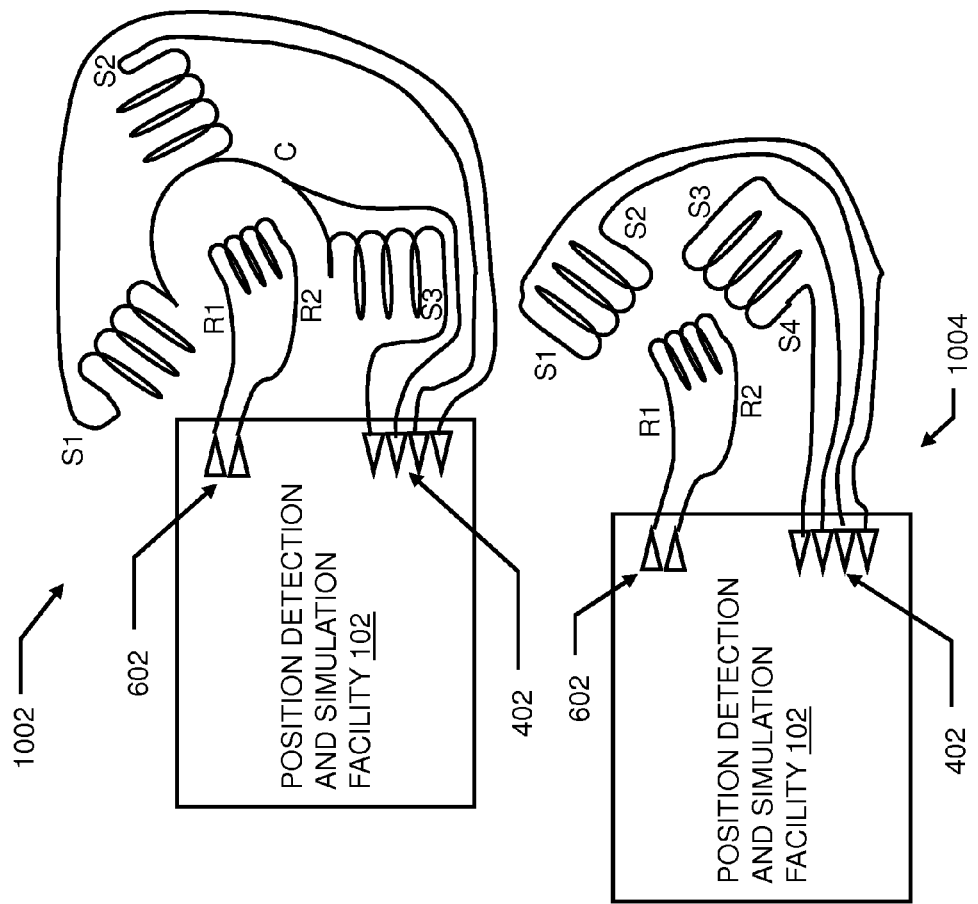
FIG. 10 depicts example synchro/resolver applications.

FIG. 10 depicts various connections of the platform 100 to a synchro/resolver and shows the standard designations for synchro and resolver applications as may be used with the platform 100. In a synchro configuration 1002 with internal excitation, two outputs 602 provide signal connection to R1 and R2 of the rotor. In this configuration R1 and R2 may be programmed to provide a differential voltage. Also in synchro configuration 1002, three inputs 402 receive stator signals S1, S2, S3 and corresponding inputs 402 connect to stator common C. In this way each of the three synchro stators, typically positioned 120 degrees apart, can be input to the position detection and simulation platform 100 for the purposes of converting synchro stator voltage signals to digital values that can be processed and analyzed by a processor. When external excitation is used, the two outputs 602 are not used for excitation; however the external excitation source is connected through standard signals Exc+ and Exc− to two additional inputs 202.

| Synchro internal excitation connectiont table: | | |
|---|---|---|
| | Synchro (three 120° stator coils) | |
| | Output 602 | Input 202 |
| Input, internal excitation | R1 and R2 connected to two linked outputs 602 | S1, S2, S3 connect to inputs 402. Stator common connects to related inputs |

In resolver configuration 1004 that includes internal excitation, rotor inputs R1 and R2 are driven by two outputs 602 of the platform 100. Each terminal of each stator winding, S1, S2, S3, and S4 is connected to one of the inputs 402 on the platform. A resolver operates by outputting a voltage on S1 through S4 that is indicative of the absolute angle of the rotor. Voltages on S1 through S4 are detected, sampled, converted to digital form, and processed by the platform 100 as herein described.

| Resolver with internally generated excitation connection table: | | |
|---|---|---|
| | Resolver (two 90° coils) | |
| | Output 602 | Input 402 |
| Input, internal excitation | R1 and R3 connected to twp related inputs 402 | S1 and S3 to paired inputs 402, and S2 and S4 to other paired inputs 402 |

Figure 11:
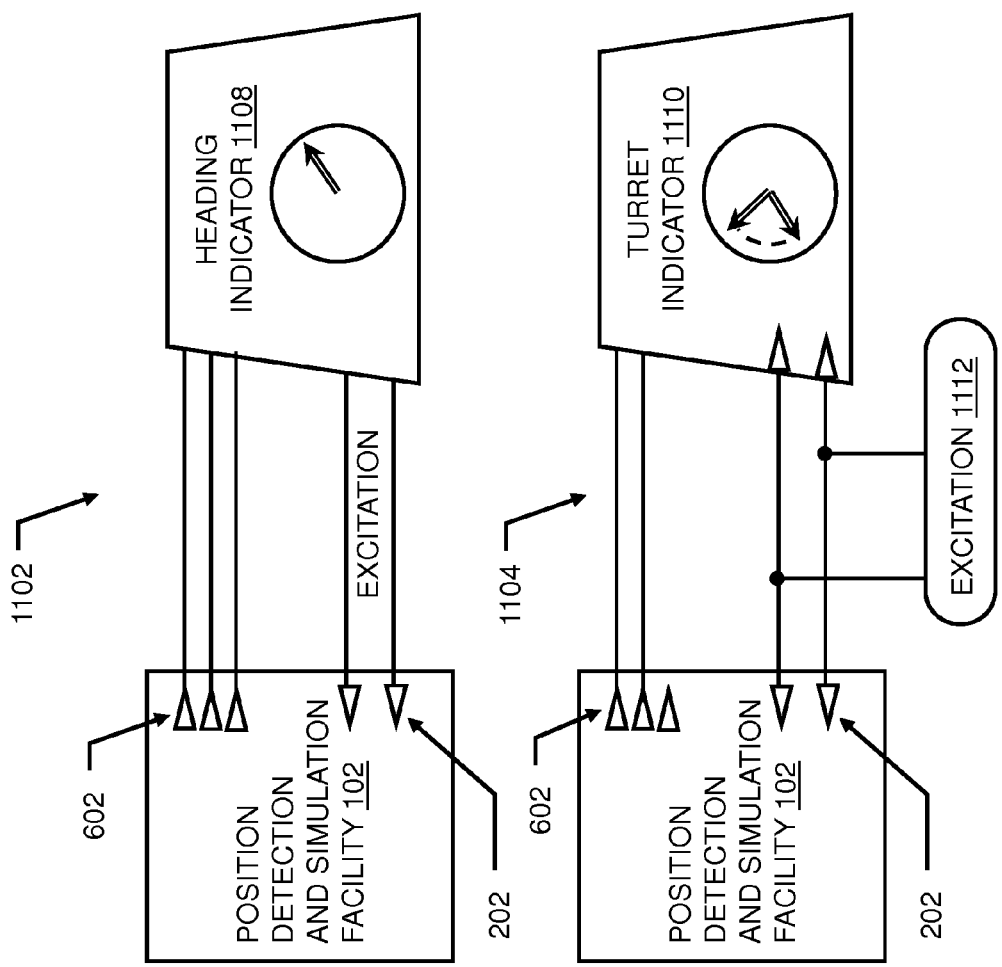
FIG. 11 depicts example synchro/resolver simulation.

Referring to FIG. 11, synchro and resolver simulation may be provided by connecting outputs from the platform in place of stator output voltage signals in synchro and resolver applications, test environments, simulation environments, and the like. Heading indicator simulation scenario 1102 includes excitation provided to the facility 102 by a heading indicator module 1108. The excitation signal may normally be transmitted to a compass or the like that would return stator signals that the heading indicator module 1108 would translate into a heading indication to be represented by the pointer dial. In this simulation configuration 1102, excitation is processed by the facility 102 and combined with software programmable waveform control and data so that the heading indicator 1108 receives signals from the platform 100 outputs 602 that are indistinguishable from those provided by the compass. Similarly, a turret indicator simulation scenario 1104 includes an excitation source. However, in the turret simulation scenario 1104, both a turret indicator 1110 and the facility 102 receive excitation from an independent excitation source 1112. This configuration is typical of actual flight and flight simulator installations that include a common 28 Vrms excitation signal for position sensing and indicating devices. The position detection and simulation facility 102 receives the external excitation 1112 and provides stator equivalent signals from outputs 602 that simulate a device such as a synchro or resolver. The following table represents connections for simulation of synchro and for resolver in both internal excitation and external excitation modes.

Synchro/Resolver Simulation table:

| | Synchro (three 120° coils) | | Resolver (two 90° coils) | |
|---|---|---|---|---|
| | Output 602 | Input 402 | Output 602 | Input 402 |
| Simulate, internal excitation | S1, S2, and S3 signals driven from three different outputs 602, rotor R1 and R2 driven from two linked outputs | no connection necessary | S1 and S3 to linked outputs 602, S2 and D4 to other linked outputs 602 rotor R1 and R2 driven from a third pair of linked outputs | no connection necessary |
| Simulate, external excitation | S1, S2, and S3 signals driven from three different outputs 602, | Excitation readback by connecting to an input 402 pair | S1 and S3 to linked outputs 602, S2 and D4 to other linked outputs 602 | Excitation readback by connecting to an input 402 pair |

The above describe architecture, features, software interface, programmability, memory map, connection examples, and the like may support a wide variety of products that include LVDT/RVDT digital converter and simulation systems, synchro/resolver digital converter and simulation systems, and the like. The products supported by the platform may perform simulation, input sensing, excitation, external excitation sensing, and other capabilities without requiring any hardware tailoring, reconfiguration, or changes. An LVDT/RVDT product may support four secondary pairs through software configurable inputs, four excitation output pairs, four simulation output pairs, digital filtering, armature control support, and the like. By combining the four excitation out pairs with the four simulation output pairs, an LVDT/RVDT product based on the platform 100 may simulate four secondary (stator) pairs. A synchro/resolver product may include support for 2 I/O channels with 16 bid resolution analog to digital converters, support for 3-wire synchronizer, 4-wire and 5/6-wire resolver, outputs with independent reference per channel and accuracy of at least 4 arc-minutes. The independent reference outputs may be programmed from approximately 2 VRMS to 28 VRMS or more at 1.2 VA or more. With a frequency response of 50 to 4000 Hz and output excitation frequency generation of 50 to 4000 Hz with accuracy of 0.5%, the platform exceeds performance requirements for most industrial synchro/resolver applications. Inputs in a product may support acceleration of up to 1000 rps/s @ 4000 Hz and a step response of 150 ms-179° at 2500 Hz. Isolation among channels, from channel circuitry to chassis (ground) and from any signal pin to chassis is at least 350 Vrms.

The platform 100 may provide support for a wide variety of applications including inertial navigation reference unit (gyro or compass), automatic direction finder (ADF), omnirange system, distance measurement equipment, cockpit indicators, landing-gear positioning and control, flight-surface measurement, such as flaps, slats, rudder, and aileron, general mechanical measurement, simulation, control, test of motion electronics, and the like. Other related applications include simulation which may include simulating various types of stimulation and activation functionality as well as simulation of sensing functions, flight simulation control (e.g. synchro or resolver outputs to drive attitude indicators), flight simulation monitoring, test providing synchro or resolver output as a test source for a wide range of synchro or resolver input devices, and the like. The platform provides multi-channel interface sensing and control and may facilitate multi-speed applications by performing coarse detection on one channel and fine detection on another.

The methods and systems of the platform 100 may be beneficially and productively employed in a variety of markets including avionics, flight simulation, airborne control, shipboard control and sensing, navigation (e.g. inertial reference, gyro, compass, automatic direction finders), radar, robotics, oil field exploration, motor control and commutation, machine tool control, process control, antenna positioning, data acquisition, fire control, aero space programs, production test, calibration, and the like. Avionics may further include avionics test, jet engine control, cockpit indicators, landing gear positioning & control, flap actuators, and simulation which may benefit from a significant reduction in wiring related costs for high value areas such as design, materials, installation, maintenance, and the like.

The platform 100 may facilitate flight simulation, test, and measurement. Flight and flight simulation applications typically include one or more common excitation sources for position sensing devices and indicators. Simulation, test, and measurement in such applications may be required to support the common external excitation while conforming to the specific performance criteria of devices that are being simulated, tested, and or measured. In an example of flight simulation, the platform 100 may receive external excitation on an input 202. The platform 100 samples the excitation as herein described and determines, among other attributes, a count of reference clocks for each complete cycle of the excitation input. Using the facilities and functions of the position detection and simulation facility 102 of the platform 100 at least a simulation output clock is derived from the excitation input. The platform 100 may factor in measured drift, and the like present in the excitation input to be included in or at least influence the simulated output. In the example, the simulation output clock may be adjusted according to the measured drift of the excitation signal from one cycle to another so that the simulated output signals reflect real-world responses to the changes present in the excitation signal. Coordinated with the excitation signal, an output waveform simulating a real-world device such as an LVDT/RVDT, synchro, resolver, and the like may be generated.

The simulated output may include at least a phase offset relative to the excitation signal to reflect real-world delays associated with signal transmission through an aircraft, device delays, and the like. A simulator for an older model aircraft that uses synchros and resolvers designed and produced decades earlier, may require substantially different phase shift response and performance than a simulator for a current production aircraft. The programmability and flexibility of configuration of the platform 100 makes possible support for these potentially very different real-world situations without changing, tailoring, or reconfiguring hardware on the platform. Similarly, devices within a single aircraft simulator may need to be simulated with very different performance characteristics. A single embodiment of the platform 100 may be produced and used for these different applications because of the high degree of configuration and operational flexibility inherent in the platform 100.

The signals that are output from a position and angle digital detection and simulation system as described herein may benefit from dynamic signal-based power delivery. In particular the signals being output are generated or controlled by the system and therefore can be efficiently and effectively used to control supply voltage being provided to each individual output driver. In some embodiments of the system, the system drives a plurality of sinusoidal signals that are synchronized so each is always driving in phase or is one-hundred-eighty degrees out of phase. In these embodiments, the synchronous signals zero crossing is consistent so active control of the power rails for the output buffers could be applied simultaneously across a plurality of outputs. Therefore, whether dynamic signal-based supply voltage delivery is conducted for a positive power rail, each of a positive and negative power rail, for a single output driver, for several output drivers, or individually for a plurality of output drivers, each supply voltage delivery may be based on a signal that is being provided to an output driver.

In one embodiment, we take advantage of features of commonly available DC/DC converters that generate the supply voltage (DC/DC converter output) based on a signal presented to the converter. This signal is generally known as an output feedback signal to help in stabilizing the output as a result of load changes, and the like. Most common off-the-shelf (COTS) DC/DC converters are active devices that operate internally at greater than a megahertz to convert an input DC voltage to an output DC voltage. Therefore, by actively controlling the 'feedback' signal provided to the DC/DC converter, the DC signal output from the converter (which can be provided as a DC supply voltage to one or more high current output drivers) should be able to be dynamically and rapidly changed. To provide active control of the DC/DC converter feedback signal that ensures that the DC output that is delivered to one more of voltage supply inputs of a high current signal driver maintains sufficient head room above the resulting signal being output from the signal driver, some information about the signal being output may be required, such as frequency, slew rate, peak output voltage (positive and/or negative), DC offset, and the like.

In an embodiment, a 1.2 MHz operating frequency DC/DC converter provides an output adjustment response rate that can readily match at least a 1 KHZ sinusoidal signal based on a DC/DC feedback signal with a frequency of change of approximately 250 KHz. Providing feedback to the DC/DC converter at a rate that is much higher than the signal being delivered to the power driver/amplifier facilitates requesting small, incremental changes in the supply voltage out of the DC/DC converter while enabling a slew rate that is much greater than the signal primary 1 KHz frequency. Generally an embodiment as described herein facilitates signal-based amplifier/driver supply voltage control based on any signal that is substantially sinusoidal.

If the signal that is provided to the amplifier/driver is well known and therefore highly predictable, and/or if it can be sampled prior to being fed into the amplifier/driver, then a DC/DC converter feedback control function may be generated by circuitry or software that predicts, samples, or generates the signal to be amplified.

In the position and angle digital detection and simulation system described herein, because the signal(s) to be amplified/driven that are provided to the output buffer are generated by logic that is under the control of the system (e.g. a state machine in an FPGA), a circuit that generates a feedback control function for conversion (e.g. D/A) to an active feedback signal for the DC/DC controller can be built into the logic (e.g. as a function of the FPGA). A separate control signal may be generated for each individual output based on frequency and slew rate characteristics being generated in the FPGA.

An example of FPGA-based information that may facilitate generating a DC/DC converter feedback control signal may be found in one or more portions of the output logic 600 as described herein with respect to at least FIG. 6. In an example, waveform generation facility 618 may provide essential information about the shape of a waveform that may be delivered to one of the DAC 604 circuits to further be driven/amplified by one of the outputs 602. The output system described in respect to FIG. 6 may include outputs 602 which may be software controllable outputs. These outputs 602 may include one or more high current driver/amplifiers as described herein that, when controlled through the signal-based supply voltage control methods and systems described herein, may benefit from the power consumption reduction of such supply voltage control methods. Further in an example of using the waveform generation facility 618, which may provide digital waveform data to the FIFO 614, the FIFO 614 may be adapted to provide a DC/DC feedback control output signal from an earlier tap than the tap that provides the digital waveform to the DAC engine 610 for the output signal(s). Other potential sources of data or information that may be used to generate a DC/DC converter feedback control signal in 1314 clude channel conversion control data such as the current gain value, phase value, offset value, and the like for each software programmable output 602. These and other software programmable output capabilities are described herein.

Figure 12:
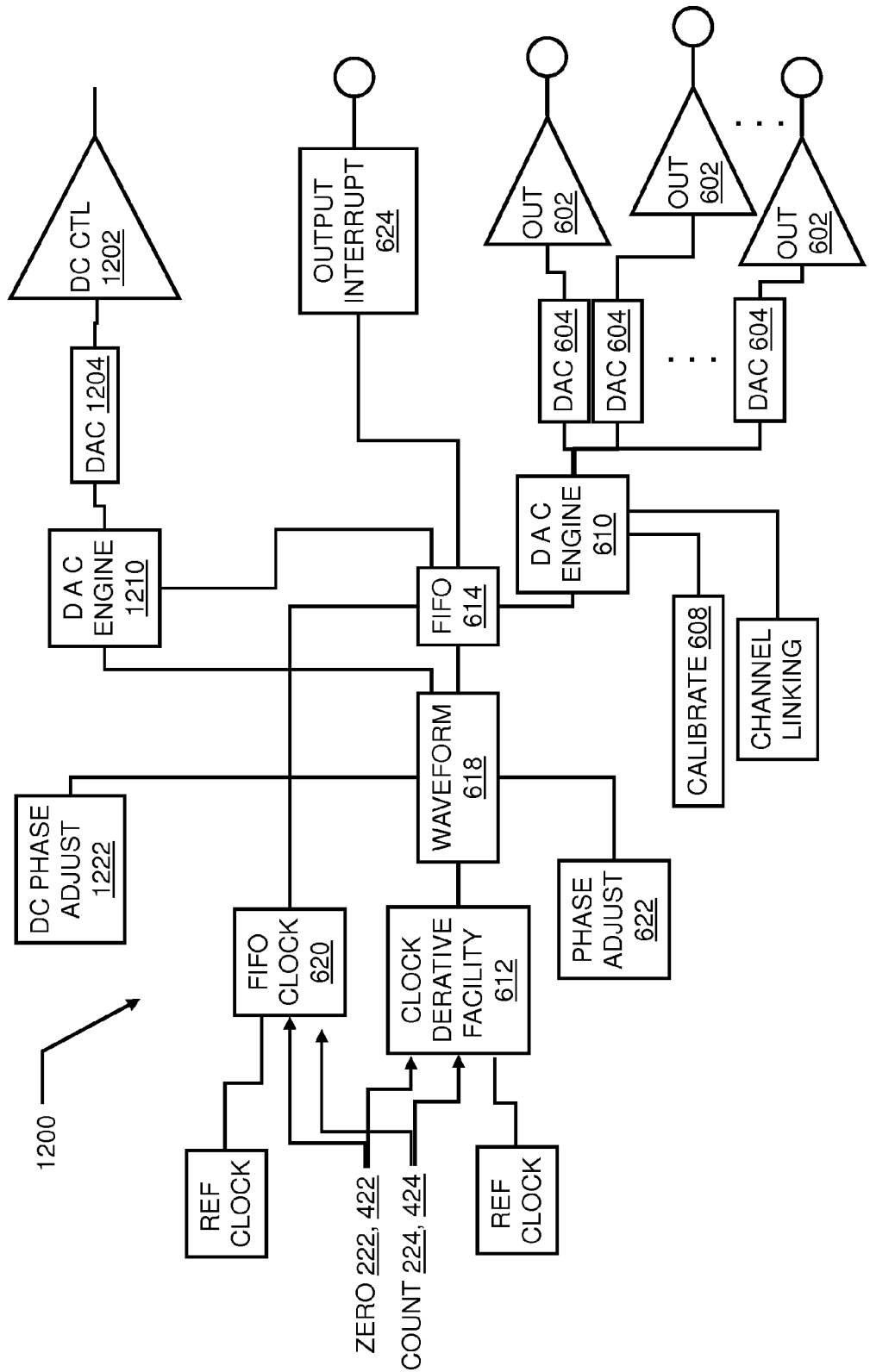
FIG. 12 depicts a schematic diagram of the output portion of FIG. 6 adapted to provide output driver power supply voltage feedback.

Referring to FIG. 12 which depicts an embodiment of generating a DC/DC converter feedback control signal, an output sub-system that is similar to that depicted in FIG. 6 incorporates dynamic power control features that also leverage the output subsystem features of the FIG. 6 that are described herein. Therefore, the differences between FIGS. 6 and 12 are presented here. DC control output driver 1202 may provide a signal that is suitable for connecting to the feedback input of COTS DC/DC converters such as LT1935 by Linear Technology and others. A digital to analog converter DAC 1204 may receive a digital signal from DAC engine 1210 and convert it to an analog signal that meets the requirements for providing feedback to a COTS DC/DC converter. DAC Engine 1210 may operate similarly to DAC engine 610 as described herein but may further integrate output signal digital waveform data from waveform facility 618 to generate a control signal that takes into account response time of a COTS DC/DC converter for providing power to one or more outputs 602. The waveform data provided from waveform facility 618 may be identified (e.g. addressed) by DC Phase adjust facility 1222. Phase adjust facility 1222 may provide a phase adjust of the waveform data provided to DAC engine 1210 relative to the waveform data that is delivered to DAC engine 610. This may allow the DC control facility 1202 to present a feedback signal to a COTS DC/DC converter so that the feedback signal precedes the output signal 602 with sufficient time offset to ensure that the DC/DC converter adjusts the DC power to the output driver (e.g. output 602) to maintain the necessary headroom above the amplitude of the signal being output from the driver.

A basic objective to achieve low power consumption is to ensure that the DC/DC converter output (which is input to the amplifier/driver supply voltage power rails) tracks the signal that is input to the amplifier/driver with a small phase offset/shift that ensures the supply voltage available to the amplifier/driver is sufficient for it to provide the power needed based on the output signal amplitude and load. Because this offset is based on the DC/DC converter response rate to changes in the feedback signal, there might be a calibration or at least characterization process that is executed during production, during setup of the position and angle digital detection and simulation system, at power up of the system, or through a dynamic calibration capability that may be built into a DC/DC converter feedback signal circuit. Such a calibration function may be needed to set the proper offset/phase shift between the control signal and the signal being amplified/driven. This offset may be implemented in the phase adjust facility 1222 to enable software based control of the phase shift between the DC/DC converter feedback control signal and the signal being amplified/driven.

In one embodiment a single DC/DC converter can be controlled to provide both positive and negative supply voltage to a plurality of outputs. This may be sufficient for a system in which the plurality of output signals are synchronized with common zero-crossing events. Two DC/DC converters for each output amplifier/driver can facilitate independent control of positive and negative supply voltages. This may facilitate having the DC/DC output that provides the positive supply voltage to the amplifier/driver tracking the positive voltage excursions of the output signal and the DC/DC output that provides the negative supply voltage to the amplifier/driver tracking the negative voltage excursions of the output signal. Requirements for the power supply voltage provided out of each DC/DC converter may be represented as an equation:

$$\text{VDC/DC Out+} = \text{Max}(\text{Vlim+}, \text{Vout+Vheadroom}) \quad (1)$$

$$\text{VDC/DC Out-} = \text{Min}(\text{Vlim-}, \text{Vout-Vheadroom}) \quad (2)$$

By operating the signal amplifier/driver just above the minimum supply voltage needed to ensure low signal distortion and noise injection during signal amplification (e.g. to achieve high quality amplifier performance) such a dynamic supply voltage control method and system may facilitate achieving amplifier class B, C or D efficiency with nearly amplifier class A linearity response and output drive quality.

Another embodiment of the dynamic supply voltage control capability may include integrating such functionality into an output driver component so that the power consumption saving benefits may be provided to any implementation that requires high current signal amplification/driving. The result may be an integrated device which is an intelligent power saving amplifier/driver.

Figure 13:
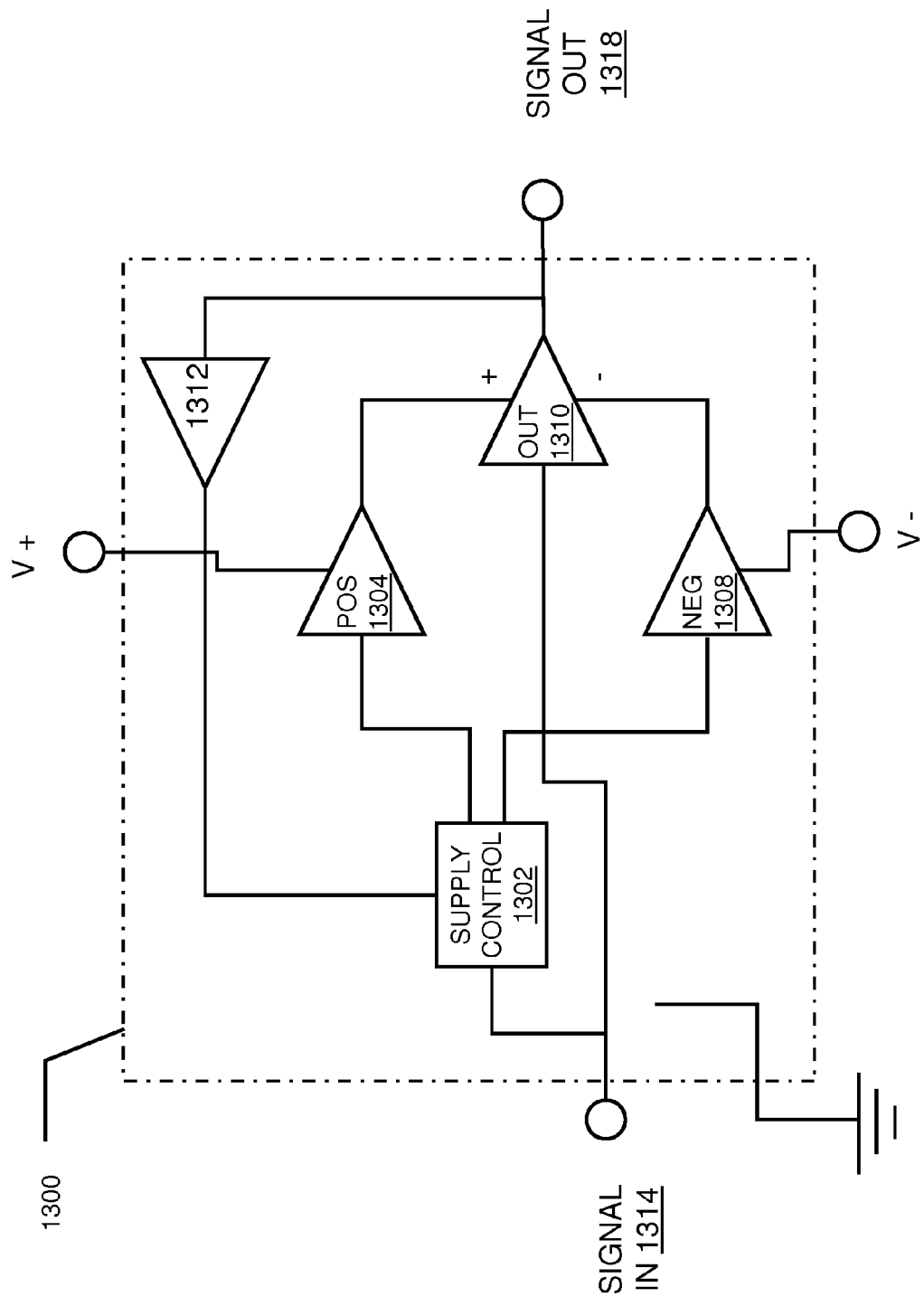
FIG. 13 depicts a schematic diagram of an integrated power saving output driver device.

Referring to FIG. 13, an integrated power saving output driver device is depicted that embodies aspects of the dynamic supply voltage control capability described herein. Power saving output driver 1300 includes a supply control circuit 1302 that senses the signal in 1314 and signal out 1318 feedback signal provided by feedback facility 1312. The supply control facility 1302 generates control signal(s) for a positive rail voltage control facility 1304 and for a negative rail voltage control facility 1308. Each of the voltage control facilities (1304 and 1308) independently provide sufficient supply voltage to output driver 1310 to enable outputting a signal out 1318 with a desired peak signal amplitude while conserving power drawn by the device 1300.

Supply control facility 1302 may detect an amplitude change on the signal in 1314 that correlates to a change in amplitude of the signal out 1318 (a typical output amplifier/driver function). The supply control facility 1302 may further detect the amplitude of the signal out 1318 through feedback facility 1312 that may sense the signal out 1318 and provide a representation of the signal out 1318. The signal out 1318 representative signal may include adjustments in amplitude, phase, or other parameters. These adjustments may be based on factors related to controlling the power that is supplied to the positive and/or negative power rail of the output driver 1310. An exemplary factor may be related to the response time of the voltage control facilities (1304 and 1308), and the like. Supply control facility 1302 may determine an adjustment factor independently for each of the positive supply voltage and the negative supply voltage that is to be provided to the output driver 1310 so that the supply voltage provided thereto exceeds the signal out 1318 amplitude by a margin that is sufficient to ensure proper drive capability and operation of the output driver 1310 and of the device 1300.

Figure 14:
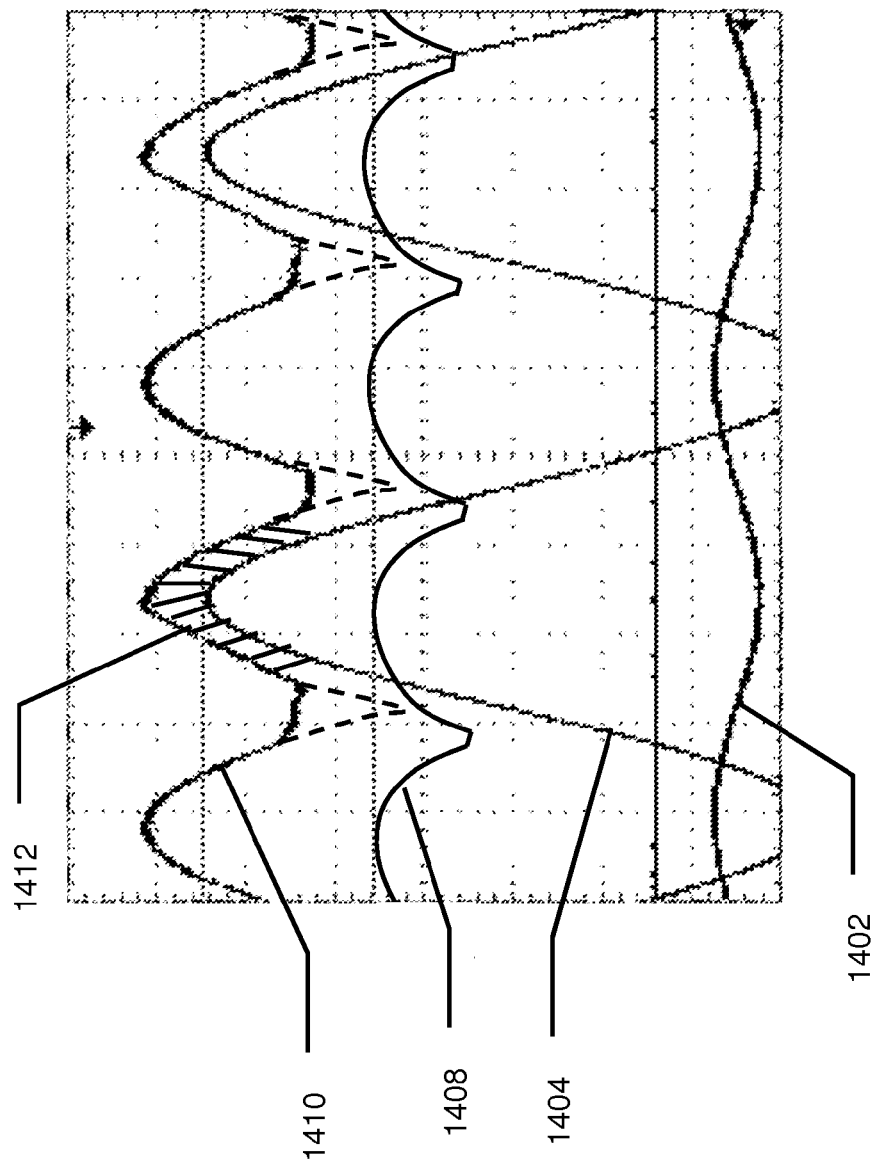
FIG. 14 depicts a waveform diagram of signals associated with embodiments of dynamically controlling an output driver power supply voltage.

FIG. 14 depicts a waveform diagram of various signals associated with the dynamic power supply control methods and systems described herein, wherein a single control function is used for dynamically controlling both the positive and negative power supplies to an amplifier/driver circuit. Waveforms 1402 and 1404 depict typical outputs being driven by amplifier/driver circuits for which DC power may be dynamically controlled. Waveform 1408 represents a feedback control signal that may be provided to the DC/DC converter. Finally, waveform 1410 represents a positive voltage supply rail of the amplifier/driver circuit. In the embodiment represented by FIG. 14, waveform 1410 shows that the DC/DC converter responds to the output signal 1404 so that a minimum headroom 1412 is maintained on the positive voltage supply rail. Since the embodiment that produces these representative waveforms uses a single feedback signal 1408 that affects both positive and negative power supply rails, note that waveform 1410 responds to the control signal 1408 for both positive and negative excursions of the output signal 1404.

The elements depicted in flow charts and block diagrams throughout the figures imply logical boundaries between the elements. However, according to software or hardware engineering practices, the depicted elements and the functions thereof may be implemented as parts of a monolithic software structure, as standalone software modules, or as modules that employ external routines, code, services, and so forth, or any combination of these, and all such implementations are within the scope of the present disclosure. Thus, while the foregoing drawings and description set forth functional aspects of the disclosed systems, no particular arrangement of software for implementing these functional aspects should be inferred from these descriptions unless explicitly stated or otherwise clear from the context.

Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A method of multi-resolution position detection, comprising:
   providing a position detection and simulation platform comprising a plurality of software-configurable channels capable of identical functionality; and
   configuring a first channel and a second channel of the software configurable channels differently for facilitating concurrent detection of a coarse position of a rotor by a first channel and a fine position of the rotor by a second channel based on a common stator signal presented to each of the two channels.

2. The method of claim 1, wherein at least one of the coarse position and fine position is detected based on a received excitation signal associated with the rotor.

3. The method of claim 2, wherein the excitation signal associated with the rotor is received by one of the first and second channels and distributed to the other channel.

4. The method of claim 1, wherein at least one of the coarse position and fine position is detected based on a simulated excitation signal.

5. The method of claim 1, further including configuring one of the plurality of software configurable channels to provide a simulated excitation signal to the rotor.

6. The method of claim 5, wherein the simulated excitation signal is provided to each of the two software configurable channels.

7. The method of claim 1, wherein the common stator signal is a simulated signal.

8. The method of claim 1, wherein the common stator signal is a simulated signal provided by the position detection and simulation platform.

9. The method of claim 1, wherein the common stator signal is a simulated signal that is generated by the position detection and simulation platform based on an excitation signal received by a third channel of the plurality of software-configurable channels.

10. The method of claim 1, wherein a detectable position of a rotor comprises at least one of a zero crossing of the rotor, an acceleration of the rotor, and a phase shift of the rotor.

11. A system of multi-resolution position detection, comprising:
    a plurality of software-configurable inputs suitable for receiving one or more stator signals and rotor excitation signals;
    a plurality of software-configurable input processing channels configurable to determine frequency characteristics of the received stator signals and excitation signals, wherein the software configurable input processing channels are capable of identical functionality;
    a first channel of the plurality of software-configurable input processing channels configured for detection of a coarse position of a rotor;
    a second channel of the plurality of software-configurable input processing channels configured for detection of a fine position of the rotor concurrently with the detection of the coarse position of the rotor; and
    wherein the concurrent detection of the coarse position and the fine position of the rotor is based on a stator signal that is common to the first channel and the second channel of the plurality of software-configurable input processing channels.

12. The system of claim 11, wherein the concurrent detection of the coarse position and the fine position is based on an excitation signal associated with the rotor.

13. The system of claim 12, wherein the excitation signal associated with the rotor is received by one of the plurality of software-configurable inputs that is associated with at least one of the first channel and the second channel.

14. The system of claim 12, wherein the excitation signal is a simulated excitation signal that is generated by the system.

15. The system of claim 11, wherein the stator signal that is common to the first channel and the second channel is simulated by the system.

16. The method of claim 11, wherein a detectable position of a rotor comprises at least one of a zero crossing of the rotor, an acceleration of the rotor, and a phase shift of the rotor.

17. A method of multi-resolution position detection with a position detection and simulation platform comprising a plurality of software-configurable channels capable of identical functionality, comprising;
    configuring a first channel of the plurality of software-configurable channels to facilitate detection of a coarse position of a rotor;

configuring a second channel of the plurality of software-configurable channels to facilitate detection of a fine position of the rotor; and concurrently facilitating detection the coarse position and the fine position of the rotor based on a common stator signal presented to each of the two channels.

18. The method of claim 17, wherein concurrently detecting the coarse position and the fine position of the rotor is facilitated by software-configurable input processing circuits that are configurable to determine frequency characteristics of stator signals and excitation signals associated with the rotor.

19. The method of claim 17, wherein concurrently detecting the coarse position and the fine position of the rotor is based on an excitation signal associated with the rotor.

20. The method of claim 17, wherein a detectable position of a rotor comprises at least one of a zero crossing of the rotor, an acceleration of the rotor, and a phase shift of the rotor.

* * * * *